US009325762B2

(12) United States Patent
Venkatachalam Jayaraman et al.

(10) Patent No.: US 9,325,762 B2
(45) Date of Patent: Apr. 26, 2016

(54) METHOD AND APPARATUS FOR EFFICIENT SIGNALING FOR COMPRESSION

(71) Applicant: QUALCOMM Incorporated, San Diego, CA (US)

(72) Inventors: Venkata Ramanan Venkatachalam Jayaraman, Del Mar, CA (US); Rohit Kapoor, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 14/067,703

(22) Filed: Oct. 30, 2013

(65) Prior Publication Data

US 2014/0161036 A1    Jun. 12, 2014

Related U.S. Application Data

(60) Provisional application No. 61/735,729, filed on Dec. 11, 2012.

(51) Int. Cl.
*H04W 4/00*   (2009.01)
*H04L 29/06*  (2006.01)
*H03M 7/30*   (2006.01)
*H04W 28/06*  (2009.01)

(52) U.S. Cl.
CPC .............. *H04L 65/601* (2013.01); *H04L 69/04* (2013.01); *H03M 7/6082* (2013.01); *H04W 28/06* (2013.01)

(58) Field of Classification Search
CPC .................................................... H04W 80/04
USPC ......................................................... 370/328
See application file for complete search history.

(56) References Cited

U.S. PATENT DOCUMENTS 6,121,903 A    9/2000 Kalkstein
6,195,024 B1   2/2001 Fallon
6,598,074 B1   7/2003 Moller et al.
(Continued)

FOREIGN PATENT DOCUMENTS

WO    99/67886 A1    12/1999

OTHER PUBLICATIONS

International Search Report and Written Opinion—PCT/US2013/068968—ISA/EPO—Feb. 28, 2014 (130699WO), 12 total pages.
(Continued)

*Primary Examiner* — Samina Choudhry
(74) *Attorney, Agent, or Firm* — Arent Fox LLP

(57) ABSTRACT

An apparatus and method of wireless communication includes determining, at a compressor component, whether to transmit a current data packet as a compressed current data packet or an uncompressed current data packet. Further, these aspects include determining whether a data sequence in the current data packet matches a first or second data sequence when determining to transmit the uncompressed current data packet, wherein the first data sequence indicates a first compression state and the second data sequence indicates a second compression state. Also, these aspects include adding the second data sequence to the uncompressed current data packet for transmission when the data sequence in the current data packet matches the first or second data sequence. Additionally, these aspects include transmitting the uncompressed current data packet with the second data sequence when the data sequence in the current data packet matches the first or second data sequence.

29 Claims, 11 Drawing Sheets

(56) References Cited

U.S. PATENT DOCUMENTS

| | | | |
|---|---|---|---|
| 7,447,814 | B1 | 11/2008 | Ekman |
| 2004/0160983 | A1* | 8/2004 | Kuskin et al. ........... 370/471 |
| 2009/0245382 | A1 | 10/2009 | Ekman |
| 2010/0039942 | A1* | 2/2010 | Nakatsuji et al. ........ 370/241 |
| 2012/0182163 | A1 | 7/2012 | Cho et al. |
| 2013/0077486 | A1* | 3/2013 | Keith ..................... 370/230.1 |

OTHER PUBLICATIONS

Co-pending U.S. Appl. No. 13/960,583, filed Aug. 6, 2013.
Co-pending U.S. Appl. No. 14/084,272, filed Nov. 19, 2013.
Co-pending U.S. Appl. No. 14/099,478, filed Dec. 6, 2013.

* cited by examiner

METHOD AND APPARATUS FOR EFFICIENT SIGNALING FOR COMPRESSION

CLAIM OF PRIORITY UNDER 35 U.S.C. §119

The present application for patent claims priority to U.S. Provisional Application No. 61/735,729 entitled "METHOD AND APPARATUS FOR EFFICIENT SIGNALING FOR COMPRESSION" filed Dec. 11, 2012, and assigned to the assignee hereof and hereby expressly incorporated by reference.

REFERENCE TO CO-PENDING APPLICATIONS FOR PATENT

The present application for patent is related to the following co-pending U.S. patent applications:

U.S. application Ser. No. 13/960,583, now issued as U.S. Pat. No. 9,166,620, entitled "METHOD AND APPARATUS FOR A MEMORY BASED PACKET COMPRESSION ENCODING", filed Aug. 6, 2013, assigned to the assignee hereof, and expressly incorporated by reference herein; and U.S. application Ser. No. 14/099,478, now issued as U.S. Pat. No. 9,172,772, entitled "METHOD AND APPARATUS FOR DISABLING COMPRESSION FOR INCOMPRESSIBLE FLOWS", filed concurrently herewith, assigned to the assignee hereof, and expressly incorporated by reference herein; and U.S. application Ser. No. 14/084,272, entitled "METHOD AND APPARATUS FOR CLASSIFYING FLOWS FOR COMPRESSION", filed concurrently herewith, assigned to the assignee hereof, and expressly incorporated by reference herein.

BACKGROUND

Aspects of the present disclosure relate generally to wireless communication systems, and more particularly, to an apparatus and method for improving the signaling of data compression for an efficient determination of whether a data packet is compressed or uncompressed, thereby providing consistent service in a wireless communication system.

Wireless communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). The UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). The UMTS also supports enhanced 3G data communications protocols, such as High Speed Packet Access (HSPA), which provides higher data transfer speeds and capacity to associated UMTS networks.

In some wireless communications systems, a compressor component may execute a compression algorithm to compress all packets transmitted to a de-compressor component that executes a corresponding de-compression algorithm. In some cases, though, the compressor component may encounter packets that would be better left uncompressed. In these cases, however, the compressor may not be able to send an uncompressed packet to the de-compressor component, as the de-compressor component may operate under the assumption that all packets received from the compressor component are compressed.

Thus, improvements are desired in exchanging a data packet between a compressor component and a de-compressor component.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, a method of wireless communication includes determining, at a compressor component, whether to transmit a current data packet as a compressed current data packet or an uncompressed current data packet. Further, these aspects include determining whether a data sequence in the current data packet matches a first or second data sequence when determining to transmit the uncompressed current data packet, wherein the first data sequence indicates a first compression state and the second data sequence indicates a second compression state. Also, these aspects include adding the second data sequence to the uncompressed current data packet for transmission when the data sequence in the current data packet matches the first or second data sequence. Additionally, these aspects include transmitting the uncompressed current data packet with the second data sequence when the data sequence in the current data packet matches the first or second data sequence.

In another aspect, an apparatus for wireless communication includes a compression determining component, at a compressor component, configured to determine whether to transmit a current data packet as a compressed current data packet or an uncompressed current data packet. Further, the apparatus includes a data sequence analyzer component configured to determine whether a data sequence in the current data packet matches a first data sequence or a second data sequence when determining to transmit the uncompressed current data packet, wherein the first data sequence is configured to indicate a first compression state and the second data sequence is configured to indicate a second compression state. Also, the apparatus includes a data sequence adding component configured to add the second data sequence to the uncompressed current data packet for transmission when the data sequence in the current data packet matches the first data sequence or the second data sequence. Additionally, an outputting component configured to transmit the uncompressed current data packet with the second data sequence when the data sequence in the current data packet matches the first data sequence or the second data sequence.

These and other aspects of the disclosure will become more fully understood upon a review of the detailed description, which follows.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

As discussed above, a compressor component executing a compression algorithm may encounter data packets that would be better left uncompressed. This might occur, for example, if a compression overhead causes the data packet size to increase after application of compression. For example, when the data packet is compressed less than a size of a compression header added to the data packet by the compression process. Moreover, signaling of a compression state of a data packet may not be efficient.

The present apparatus and method determine whether or not to compress a data packet, and provide a mechanism for efficient signaling of a compression state of a transmitted data packet.

Figure 1:
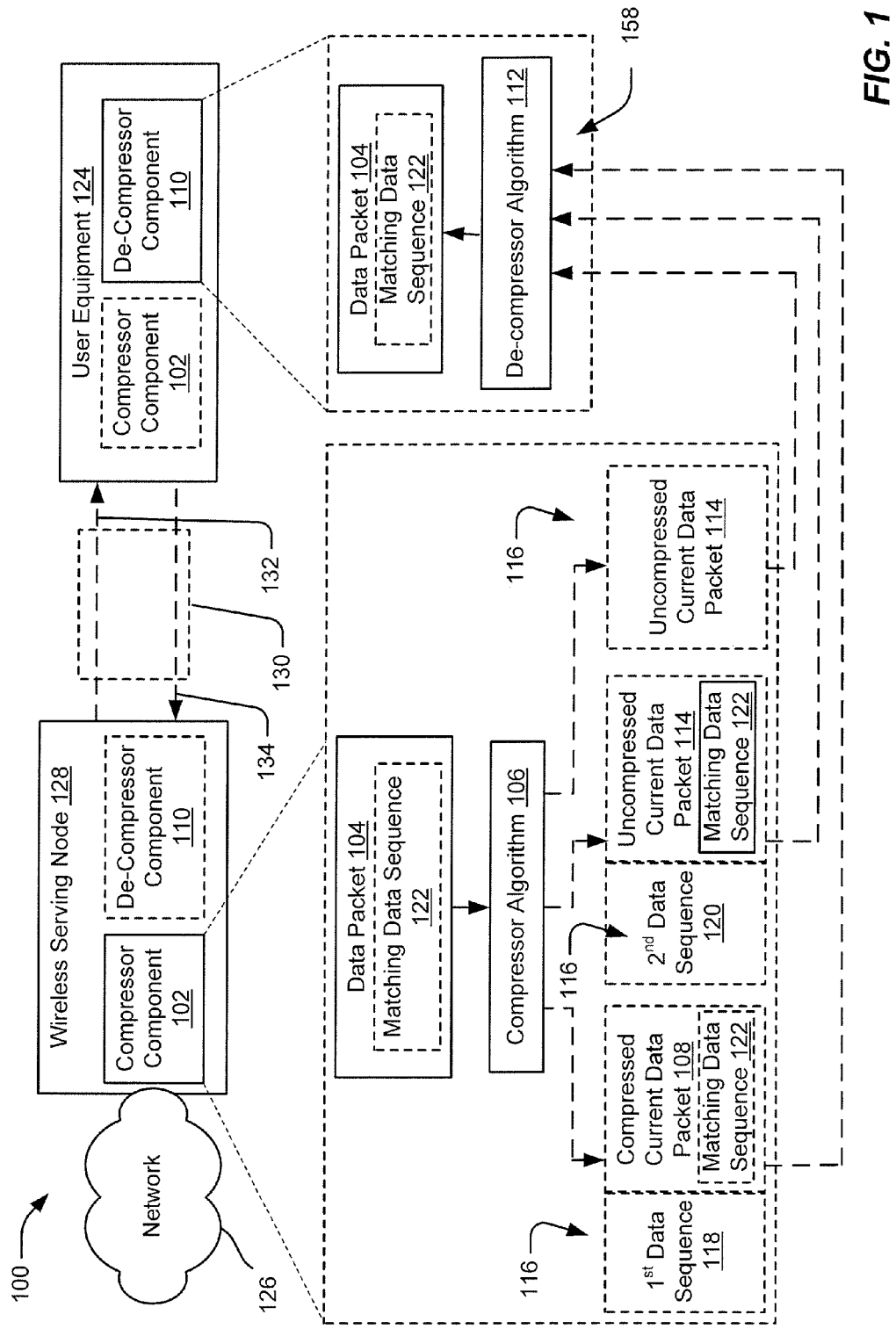
FIG. 1 is a schematic diagram illustrating an example aspect of a system that includes a compressor configured to determine to compress or not decompress a data packet, and to provide corresponding signaling to a de-compressor component, which may be implemented in a wireless communication system.

Referring to FIG. 1, in one aspect, a wireless communication system 100 includes a compressor component 102 configured to receive a current data packet 104, apply a compression algorithm 106 to current data packet 104, and generate a compressed data packet 108 for transmission to a de-compressor component 110. De-compressor component 110 is configured to receive compressed data packet 108, apply a de-compression algorithm 112 to compressed data packet 108, and generate current data packet 104. As noted above, in some cases, it may not be desirable to compress current data packet 104. As such, compressor component 102 is further configured to determine whether to transmit current data packet 104 as compressed current data packet 108 or an uncompressed current data packet 114. For example, based on analyzing a content of current data packet 104, compressor component 102 may determine that compression overhead is greater than a potential reduction in size of current data packet 104. Additionally, compressor component 102 is configured to provide signaling 116 to de-compressor component 110 in order to indicate a compression state of the data packet. According to the present aspects, signaling 116 includes a first data sequence 118 that may be transmitted with a data packet to indicate a first compression state. In an aspect, first compression state 118 is an indicator of compression, e.g., compressed or uncompressed, or an indicator of a change in compression relative to a prior data packet. If signaling 116 included only the use of first data sequence 118, however, then an ambiguity may arise when a data packet that originally includes first data sequence 118 is sent as is, in its original state. In this case, de-compressor component 110 may detect first data sequence 118 in the original data packet and mistakenly interpret signaling 116 of a compression state, which may lead to errors or wasted resources. As such, signaling 116 of the present aspects additionally includes a second data sequence 120 that may be transmitted with a data packet to indicate a second compression state. Similar to first data sequence 118, the compression state indicated by second data sequence 120 may be an indicator of compression, e.g., compressed or uncompressed, or an indicator of a change in compression relative to a prior data packet.

In these aspects, second data sequence 120 is configured to avoid any ambiguity at de-compressor component 110 as to whether a data sequence, e.g., a matching data sequence 122, in a data packet that matches signaling 116 of the present aspects, e.g., first data sequence 118 or second data sequence 120, is part of the original data packet or if the data sequence is signaling 116 of the compression state. In particular, according to the present aspects, compressor component 102 is configured to determine whether current data packet 104 includes matching data sequence 122, and as such may be confused with signaling 116 of the first compression state or the second compression state. If current data packet 104 is determined to include matching data sequence 122, then compressor component 102 is configured to add second data sequence 120 to an uncompressed current data packet 114 or a compressed current data packet 108, depending on which aspect in this disclosure is being implemented, for transmission in order to efficiently signal a compression state of the transmitted data packet to de-compressor component 110. Uncompressed current data packet 114 and compressed current data packet 108 respectively include the original, current data packet 104 and a reduced data size version of the original, current data packet 104 generated by compressor component 102 as a result of applying compressor algorithm 106, including a determination as to whether or not to compress, on current data packet 104 according to these aspects.

Moreover, in an alternative or additional aspect, compressor component 102 executing compression algorithm 106 as described in this disclosure may determine to not compress current data packet 104. Further, compressor component 102 may determine that current data packet does not include matching data sequence 122. As such, compressor component 102 may generate uncompressed current data packet 114 for transmission to de-compressor component 110 without any additional data sequence. In this case, signaling 116 may be considered to be current data packet 104 transmitted "as is," e.g., as uncompressed data packet 114 without either first data sequence 118 or second data sequence 120. For example, in one or more aspects, current data packet 104 transmitted "as is" may be understood to be uncompressed current data packet 114 or current data packet 104 without a change in compression relative to a previous data packet.

Correspondingly, de-compressor component 110 is configured to identify signaling 116 of a compression state of a received current data packet 158 based on analyzing the contents of received current data packet 158. In one aspect, signaling 116 identifies whether or not received current data packet 158 is compressed. In another aspect, signaling 116 identifies whether a compression state of received current data packet 158 is different from, e.g., has changed relative to, a prior data packet. As such, depending on the operation of compressor component 102, received current data packet 158 may be any one of compressed current data packet 108 with first data sequence 118 (and optionally including matching data sequence 122), uncompressed current data packet 114 with second data sequence 118 (and including matching data sequence 122), and uncompressed current data packet 114 "as is" or without either first data sequence 118 or second data sequence 120. In particular, in an aspect, de-compressor component 110 executes de-compressor algorithm 112 to determine whether received current data packet 158 includes first data sequence 118 or second data sequence 120, or alternatively or in addition, if the received data packet does not include either of first data sequence 118 or second data sequence 120. If de-compressor component 110 detects one of first data sequence 118 or second data sequence 120, then de-compressor component 112 is configured to remove first data sequence 118 or second data sequence 120 from the received data packet and to further process the remaining portion of the received data packet, which may be compressed current data packet 108 or uncompressed current data packet 114, depending on the aspect, at least according to the compression state indicated by the removed data sequence. As such, depending on the aspect, de-compressor component 110 may or may not apply de-compression to the remaining portion of received current data packet 158, e.g., after removal of first data sequence 118 or second data sequence 120, in order to output current data packet 104. Alternatively or in addition, in one aspect, if de-compressor component 110 does not detect one of first data sequence 118 or second data sequence 120 in received current data packet 158, then de-compressor component 112 is configured to understand that it has received current data packet 158 "as is" or in a same compression state as a prior data packet. In any case, de-compressor component 110 may then generate and forward the resulting current data packet 104 for further processing.

Accordingly, in one aspect that should not be construed as limiting, first data sequence 118 indicates a compressed data packet, while second data sequence indicates an uncompressed data packet. In another aspect that should not be construed as limiting, first data sequence 118 indicates a change in compression state relative to a prior data packet, whereas second data sequence 120 indicates no change in compression state relative to a prior data packet. In other words, in this latter aspect, a data packet sent with first data sequence 118 or second data sequence 120 may be compressed or uncompressed, and de-compressor component 110 either changes a de-compression state or operation based on detecting first data sequence 118 or maintains a same de-compression state or operation based on detecting second data sequence 118.

As such, according to the present aspects, even when current data packet 104 originally includes first data sequence 118 or second data sequence 120, which may be mistaken for signaling 116 of a compression state, the present apparatus and methods configure compressor component 102 to add first data sequence 118 or second data sequence 120 to the original packet, and configure de-compressor component 110 to remove first data sequence 118 or second data sequence 120 from the received data packet and process the remaining portion of the received data packet, e.g., compressed current data packet 108 or uncompressed current data packet 114, according to the respective compression state indicated by first data sequence 118 or second data sequence 120.

In one example of a possible implementation of the present aspects, which should not be construed as limiting, wireless communication system 100 includes at least one UE 124 that may communicate wirelessly with one or more networks 126 via one or more serving nodes, including, but not limited to, wireless serving node 128, over one or more wireless links 130. The one or more wireless link 130 may include, but are not limited to, signaling radio bearers and/or data radio bearers. Wireless serving node 128 may be configured to transmit one or more signals 132 to UE 124 over the one or more wireless link 130, and/or UE 124 may transmit one or more signals 134 to wireless serving node 128. In an aspect, signal 132 and signal 134 may include, but are not limited to, one or more messages or one or more data packets being sent from the network 126 via wireless serving node 128 to the UE 124, and vice versa.

In an aspect, network 126 or wireless serving node 128 may include compressor component 102 configured to receive current data packet 104 destined for UE 124, apply compression algorithm 106 to current data packet 106, and generate compressed current data packet 108 or uncompressed current data packet 114 with signaling 116 for transmission to UE 124. As discussed, signaling 116 indicates a compression state of the transmitted data packet, and includes first data sequence 118 indicating a first compression state and second data sequence 120 indicating a second compression state. Alternatively, or in addition, compressor component 102 may send current data packet 104 "as is" when no compression is applied and when current data packet 104 does not include matching data sequence 122. Correspondingly, UE 124 may include de-compressor component 110 configured to receive the transmitted data packet, apply one de-compression algorithm 112 to remove first data sequence 118 or second data sequence 120, if detected, and perform or not perform de-compression operations depending on the compression state indicated by the detected signaling 116. As a result, de-compression component 110 generates the original current data packet 104 for further processing at the UE 124, such as to generate an output of a voice or data call. In an aspect, compressor component 102 and de-compressor component 110 may include or be implemented in one or more protocol layer entities, such as a Packet Data Convergence Protocol (PDCP) layer entity, although compressor component 102 and de-compressor component 110 may alternatively or additionally include or be implemented at entities at higher or lower layers of the protocol stack.

Moreover, in an alternative or additional aspect (as illustrated by the dashed line boxes), network 126 or wireless serving node 128 may include de-compressor component 110, and UE 124 may include compressor component 102. In this aspect, UE 124 may operate compressor component 102 for sending compressed current data packet 108 or uncompressed current data packet 114, as well as signaling 116, to network 126 or wireless serving node 128, which may operate de-compressor component 110 to analyze the received data packet, remove (if applicable) and interpret signaling 116, optionally de-compress compressed current data packet 108, and generate current data packet 104 for further processing, such as for performing call-related activities.

In these aspects, UE 124 may comprise a mobile apparatus and may be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology.

Additionally, the one or more wireless nodes in these aspects, including, but not limited to, wireless serving node 128 and/or network 126, may include one or more of any type of network component, such as an access point, including a base station or NodeB or eNodeB, a relay, a peer-to-peer device, an authentication, authorization and accounting (AAA) server, a mobile switching center (MSC), a radio network controller (RNC), etc. Further, wireless serving node 128 may include a small cell or small base station, such as, but not limited to a femtocell, picocell, microcell, or any other relatively small coverage or low power base station, as compared to a coverage area or transmit power level of a macro cell or macro base station.

Referring to FIGS. 2-5, an example of one or more operations of an aspect of compressor component 102 and/or de-compressor component 110 (FIG. 1) according to the present apparatus and methods are described with reference to one or more methods and one or more components that may perform the actions or functions of these methods. Although the operations described below are presented in a particular order and/or as being performed by an example component, it should be understood that the ordering of the actions and the components performing the actions may be varied, depending on the implementation. Moreover, it should be understood that the following actions or functions may be performed by a specially-programmed processor, a processor executing specially-programmed software or computer-readable media, or by any other combination of a hardware component and/or a software component capable of performing the described actions or functions.

Figure 2:
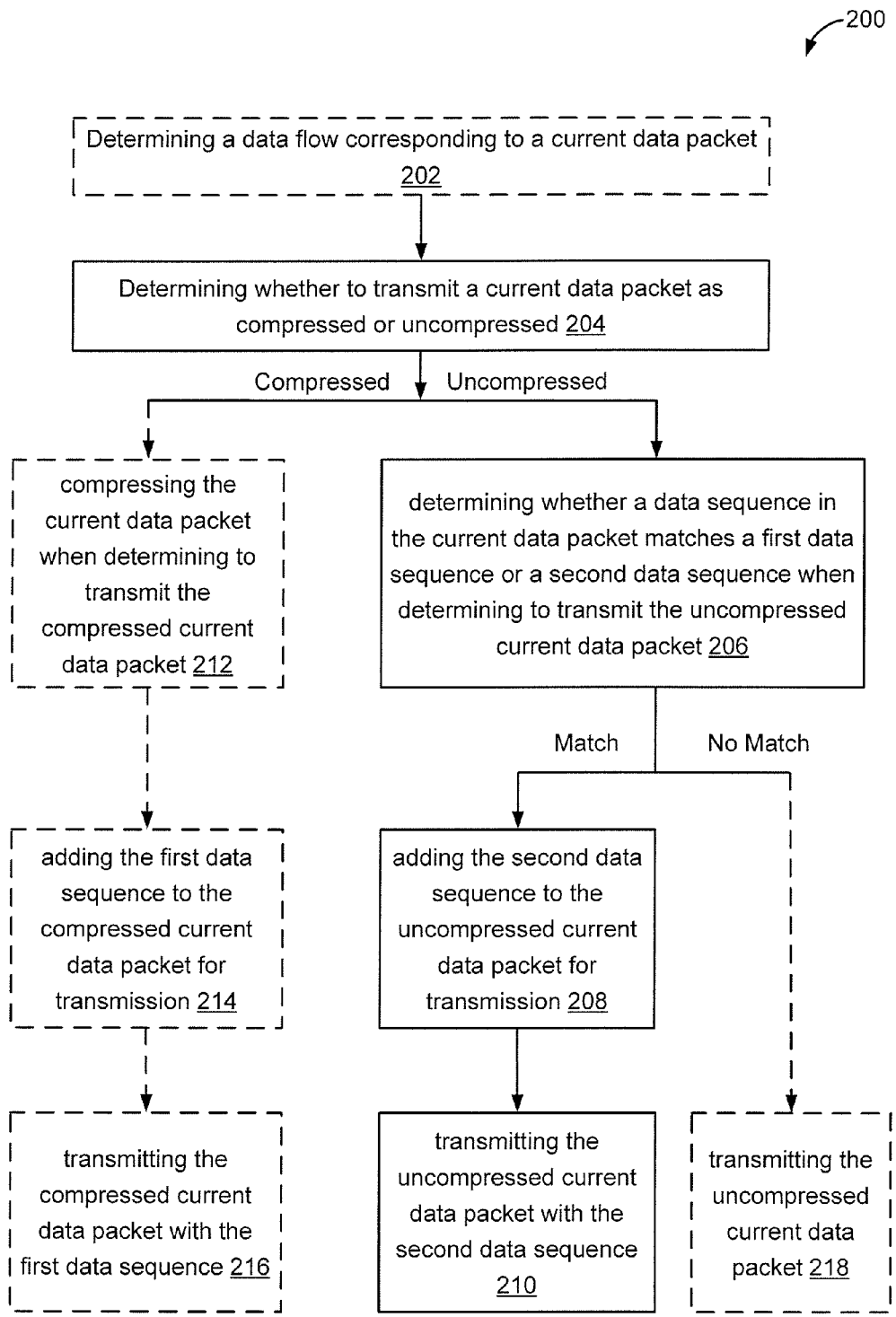
FIGS. 2 and 3 are flowcharts of aspects of methods of performing data packet compression.
Figure 5:
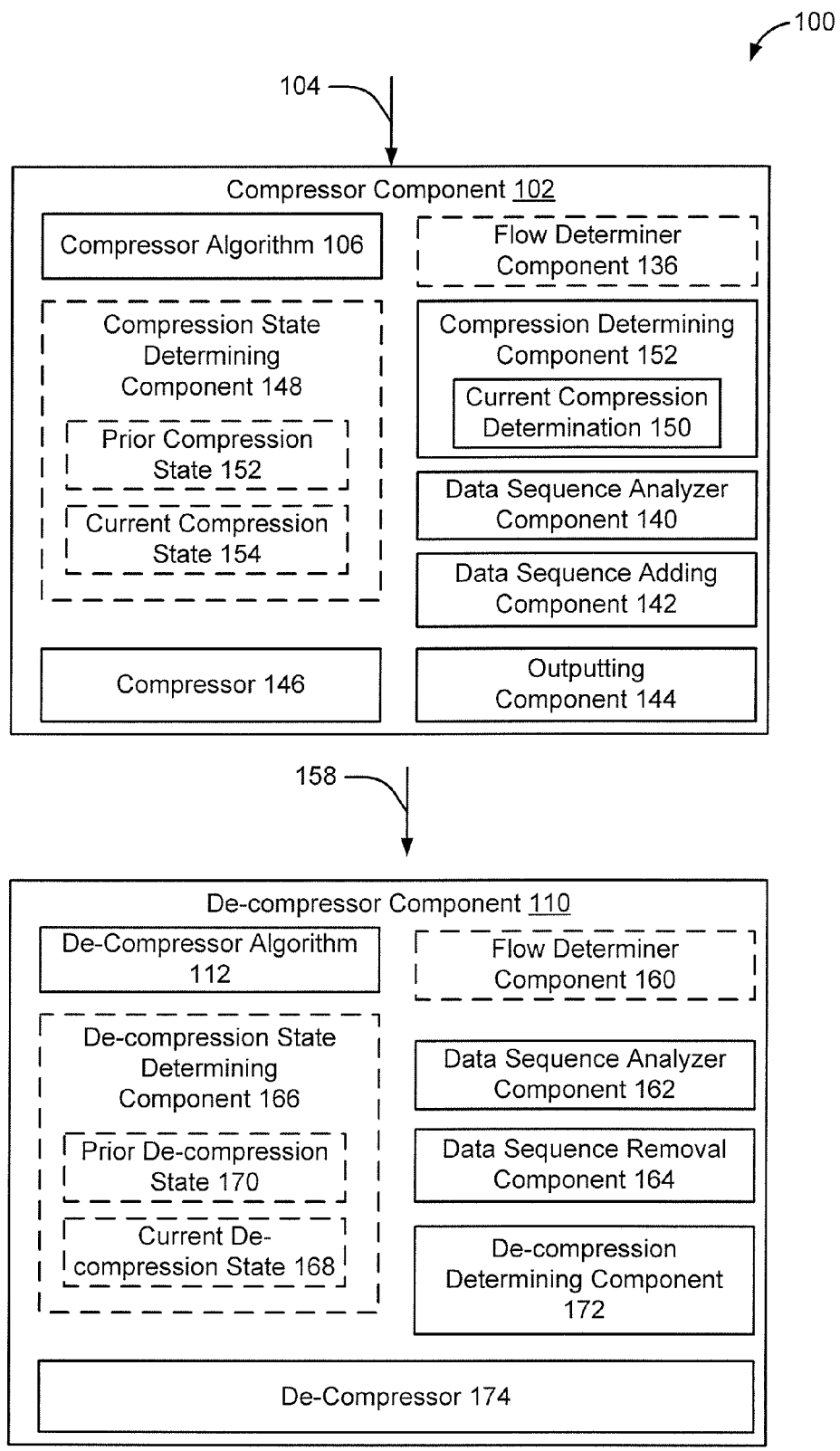
FIG. 5 is a schematic diagram including more detailed aspects of the compressor and de-compressor of FIG. 1.

Referring to FIGS. 2 and 5, in a particular aspect, a method 200 of signaling a compression state of a data packet (e.g., whether a data packet is compressed or uncompressed, or whether a state of compression of a data packet has changed relative to a prior data packet) optionally includes, at Block 202, determining a data flow corresponding to a current data packet. In an aspect, for instance, compressor component 102 may include an interface to receive current data packet 104 from a higher protocol layer entity or an application executing on a given device, such as wireless serving node 128 or UE 124, on which compressor component 102 is operating. For example, in an aspect, compressor component 102 may be configured to perform compression on data packets associated with one or more data flows. For instance, a data flow may be a logical data flow or a physical data flow that may organize or group data packets for transmission based on one or more parameters, such as but not limited to one or more Quality of Service (QoS) parameters. In an aspect, compressor component 102 may include a flow determiner component 136 configured to receive current data packet 104 and analyze a content, such as but not limited to header information, of data packet 104 to identify a data flow to which data packet 104 corresponds. For instance, flow determiner component 136 may execute an algorithm, which may be part of compressor algorithm 106, which operates to detect at least one of a port or an address corresponding to data packet 104 and to correlate one or more of a detected port or one or more addresses, or a combination thereof, to a respective data flow. For example, but not limited to this example, current data packet 104 may include information, such as in a header, of a source address, a destination address, a source port, or a destination port. For instance, in some examples, data flows may identified based on the combination of (TCP source port, TCP destination port, IP source address, IP destination address) for TCP based packets, and the combination of (UDP source port, UDP destination port, IP source address, IP destination address) for UDP based packets. In one example, but not limited to this example, to detect at least one of a port or an address corresponding to data packet 104, flow determiner component 136 may identify data values in a certain position within data packet 104 or may identify certain data values within data packet 104 that correspond to port or address information, e.g., based on a known configuration of such information or based on matching known values. Further, in one example, but not limited to this example, to correlate the detected port or address to a respective data flow, flow determiner component 136 may correlate the detected port or address to a respective data flow, such as but not limited to based on referencing a table or relational database mapping ports or addresses to data flows. As mentioned, the actions of Block 202 may only be implemented in cases where compressor component 102 is configured to selectively implement the present aspects on a data flow basis, such as in cases where some data flows may be good candidates for data compression whereas other data flows may not be good candidates for data compression, e.g., either due to an inability to compress the data or a lack of sufficient gain in doing so.

At Block 204, an aspect of method 200 may further include determining whether to transmit a current data packet as a compressed current data packet or an uncompressed current data packet. For example, in an aspect, compressor component 102 may not strictly compress any received data packet, but instead may be configured to selectively compress data packets. In an aspect, compressor component 102 may include a compression determining component 138 configured to execute an algorithm, which may be part of compressor algorithm 106, to analyze current data packet 104 and, optionally, other compression factors, in order to determine whether or not to compress current data packet 104. As noted above, in one optional aspect, compression determining component 138 may communicate with flow determining component 136, and make the compression determination based on the compression factor of whether or not current data packet 104 is associated with a data flow that is to be compressed. In another aspect, compression determining component 138 may evaluate current data packet 104 with respect to repeated data that could be extracted and represented by a pointer or other indicator having a smaller size than the repeated data. As such, in this case, compression determining component 138 may evaluate current data packet 104 to determine if a compressed packet size of the compressed version of the data packet plus the compression overhead, e.g., the pointer or other indicator representing the compressed data, is smaller than the original packet size of current data packet 104. If so, or if the compressed packet size meets a certain size threshold or reduction in size threshold, then these compression factors may be considered by compression determining component 138, which may determine to compress current data packet 104.

In another example, which should not be construed as limiting, compressor component 102 and de-compressor component 110 may have corresponding memories, which may both be the same size, e.g., based on a configuration that may specify an exact size or number of bytes to be stored. As data packets arrive at compressor component 102, the data packets are stored into the compressor memory. As the compressor memory is of a finite size, it will fill up after a given number packets. Once compressor memory is full, data (e.g., characters) from new data packets replace the oldest data in the compressor memory. So, at the beginning of a compression session, the compressor memory starts out as empty. As a result, the first few data packets may not have many gains from compression. As these first few data packets are processed, the contents of these data packets are stored into the compressor memory, which will help provide compression gains for later data packets. For instance, in this case, the first couple of data packets may have an overhead of compressor header without any reduction in the packet size. As such, in this example, compression determining component 138 may determine whether or not to compress current data packet 104 based on an order of current data packet 104 in a current compression session, e.g., such that compression determining component 138 may not compress an earlier ordered data packet but may compress a later ordered data packet.

At Block 206, an aspect of method 200 may further include determining whether a data sequence in the current data packet matches a first data sequence or a second data sequence when determining to transmit the uncompressed current data packet. For example, in an aspect, compressor component 102 may operate to avoid any ambiguity in signaling 116 by analyzing current data packet 104 to determine if it includes any data sequences that match data sequences used for signaling 116. In an aspect, for example, compressor component 102 may include a data sequence analyzer component 140 configured to execute an algorithm, which may be part of compressor algorithm 106, to inspect data within current data packet 104 and determine if current data packet 104 includes a data sequence that matches first data sequence 118 or second data sequence 102. In such a case, data sequence analyzer component 140 is configured to identifying current data packet 104 as containing matching data sequence 122, which may affect how compressor component 102 applies signaling to current data packet 104, depending on the implementation. For example, data sequence analyzer component 140 may compare on a character-by-character basis, or byte-by-byte basis, or bit-by-bit basis, characters or bytes or bits of current data packet 104 with the characters or bytes or bits of first data sequence 118 and second data sequence 102 in order to determine if there is a match. Further, for instance, but not limited to this case, when data sequence analyzer component 140 identifies current data packet 104 as containing matching data sequence 122, then this identification may affect whether or not compressor component 102 adds second data sequence 120 to current data packet 104, e.g., such as in cases where current data packet 104 is determined to not to be compressed or is determined not to include a change in compression state relative to a prior data packet. As such, with respect to Blocks 204 and 206, the present aspects may be implemented by compressor component 102 when signaling 116, e.g., first data sequence 118 and second data sequence 120, are intended to identify whether or not a given data packet is compressed. Additionally, it should be noted that in some implementations where data packets are processed by reading data in order or by reading a prefix associated with the data packet, matching data sequence 122 may only be relevant when matching data sequence 122 is positioned at the beginning of current data packet 104 or when matching data sequence 122 is a prefix. As such, in these cases, data sequence analyzer component 140 may be configured to only analyze data sequences at the beginning of current data packet 104 or data sequences that are prefixes.

At Block 208, an aspect of method 200 may further include adding the second data sequence to the uncompressed current data packet for transmission when the data sequence in the current data packet matches the first data sequence or the second data sequence. For example, in an aspect, compressor component 102 may be configured to resolve ambiguities in signaling 116 by adding second data sequence 120 to uncompressed current data packet 114 or compressed current data packet 108, depending on the given aspect being implemented. In the case of method 200, for example, compressor component 102 may include data sequence adding component 142 configured to execute an algorithm, which may be part of compressor algorithm 106, to add second data sequence 120 to uncompressed current data packet 114 for transmission when matching data sequence 122 is detected in current data packet 104. For instance, data sequence adding component 142 may communicate with data sequence analyzer component 140, such as by receiving a signal or other indication that current data packet 104 includes matching data sequence 122. In an aspect, such as in the case where data packets are processed by reading data in order or by reading a prefix associated with the data packet, data sequence adding component 142 may be configured to add second data sequence 120 to the beginning of, or as a prefix to, uncompressed current data packet 114. In other cases, however, data sequence adding component 142 may add second data sequence 120 at other positions with respect to the other data in uncompressed current data packet 114. As such, in an aspect, by adding second data sequence 120 to uncompressed current data packet 114, compressor component 102 provides a mechanism for de-compressor component 110 to distinguish signaling 116 in a received data packet from original data, as any detected second data sequence 120 may be understood to be signaling 116 when the present apparatus and methods are being operated.

At Block 210, an aspect of method 200 may further include transmitting the uncompressed current data packet with the second data sequence when the data sequence in the current data packet matches the first data sequence or the second data sequence. For example, in an aspect, compressor component 102 may include an outputting component 144 configured to execute an algorithm, which may be part of compressor algorithm 106, to send uncompressed current data packet 114 with second data sequence 120 to de-compressor component 110. In one aspect, outputting component 144 may be an interface to a transmitter component or transceiver of a device, such as wireless serving node 128 or some other entity of network 126 or of UE 124, depending on the implementation. Further, in another aspect, outputting component 144 may be the transmitter component or the transceiver of the device, such as wireless serving node 128 or some other entity of network 126 or of UE 124, depending on the implementation. As such, outputting component 144 is configured to at least initiate the transmission of uncompressed current data packet 114 with second data sequence 120 to de-compressor component 110.

At Block 212, an alternative or additional aspect of method 200 may further include compressing the current data packet when determining to transmit the compressed current data packet. For example, in an aspect, compressor component 102 may include a compressor 146 configured to execute an algorithm, which may be part of compressor algorithm 106, to compress current data packet 104. For example, compressor 146 may communicate with compression determining component 138, e.g., by receiving a signal or other indication that current data packet 104 is to be compressed. Further for example, compressor 146 may execute any one or more of a plurality of compression algorithms configured to be applied to a data packet to reduce a packet size of the data packet.

At Block 214, continuing with the alternative or additional aspect of method 200 introduced at Block 212, method 200 may further include adding the first data sequence to the compressed current data packet for transmission when determining to transmit the compressed current data packet, wherein the first data sequence indicates compressed data. For example, in an aspect where compressor component 102 provides signaling 116 to indicate whether a packet is compressed or not compressed, compressor component 102 may be configured to add first data sequence 120 to indicate that the corresponding data packet is compressed. In an aspect, for example, data sequence adding component 142 may be configured to execute an algorithm, which may be part of compressor algorithm 106, to add first data sequence 118 to compressed current data packet 108 for transmission. For instance, data sequence adding component 142 may communicate with compressor 146 and/or compression determining component 138 to identify compressed current data packet 108. In one case, for example, data sequence adding component 142 may receive compressed current data packet 108 as an input and add first data sequence 118, thereby generating an output of first data sequence 118 and compressed current data packet 108 for transmission. In an aspect, such as in the case where data packets are processed by reading data in order or by reading a prefix associated with the data packet, data sequence adding component 142 may be configured to add first data sequence 118 to the beginning of, or as a prefix to, compressed current data packet 108. In other cases, however, data sequence adding component 142 may add first data sequence 118 at other positions with respect to the other data in compressed current data packet 108. It should be noted that depending on the implementation of the present apparatus and methods, first data sequence 118 may instead be added to a compressed or uncompressed data packet to indicate a change in compression state relative to a prior data packet, as will be discussed below. As such, in an aspect, by adding first data sequence 118 to compressed current data packet 108, compressor component 102 provides a mechanism for de-compressor component 110 to distinguish signaling 116 in a received data packet from original data, as any detected first data sequence 118 may be understood to be signaling 116 when the present apparatus and methods are being operated.

At Block 216, an aspect of method 200 may further include transmitting the compressed current data packet with the first data sequence. For example, in an aspect, compressor component 102 may include outputting component 144, as described above, to send compressed data packet 108 with first data sequence 118 out of compressor component 102, e.g., destined for de-compressor component 110.

At Block 218, in another alternative or additional aspect, method 200 may further include transmitting the uncompressed current data packet when the data sequence in the current data packet does not match the first data sequence or the second data sequence when it is determined that the data sequence in the current data packet does not match the first data sequence or the second data sequence. For example, in an aspect, compressor component 102 may operate to send a data packet "as is" to de-compressor component 110. In cases where the original data of current data packet 104 does not include matching data sequence 122, then current data packet 104 sent "as is," e.g., without adding first data sequence 118 or second data sequence 120, will be interpreted by de-compressor component 110 as providing signaling 116 that indicates an uncompressed data packet or no change in compression state relative to a prior data packet. In the present case, compressor component 102 is configured to avoid operation of data sequence adding component 142 on current data packet 104 based on compression determining component 138 identifying that current data packet 104 should not be compressed and further based on data sequence analyzer component 140 identifying that current data packet 104 does not include matching data sequence 122. As such, in this case, compressor component 102 may operate outputting component 144, as described above, to send uncompressed data packet 114, e.g., the original current data packet 104, out of compressor component 102, e.g., destined for de-compressor component 110.

Figure 3:
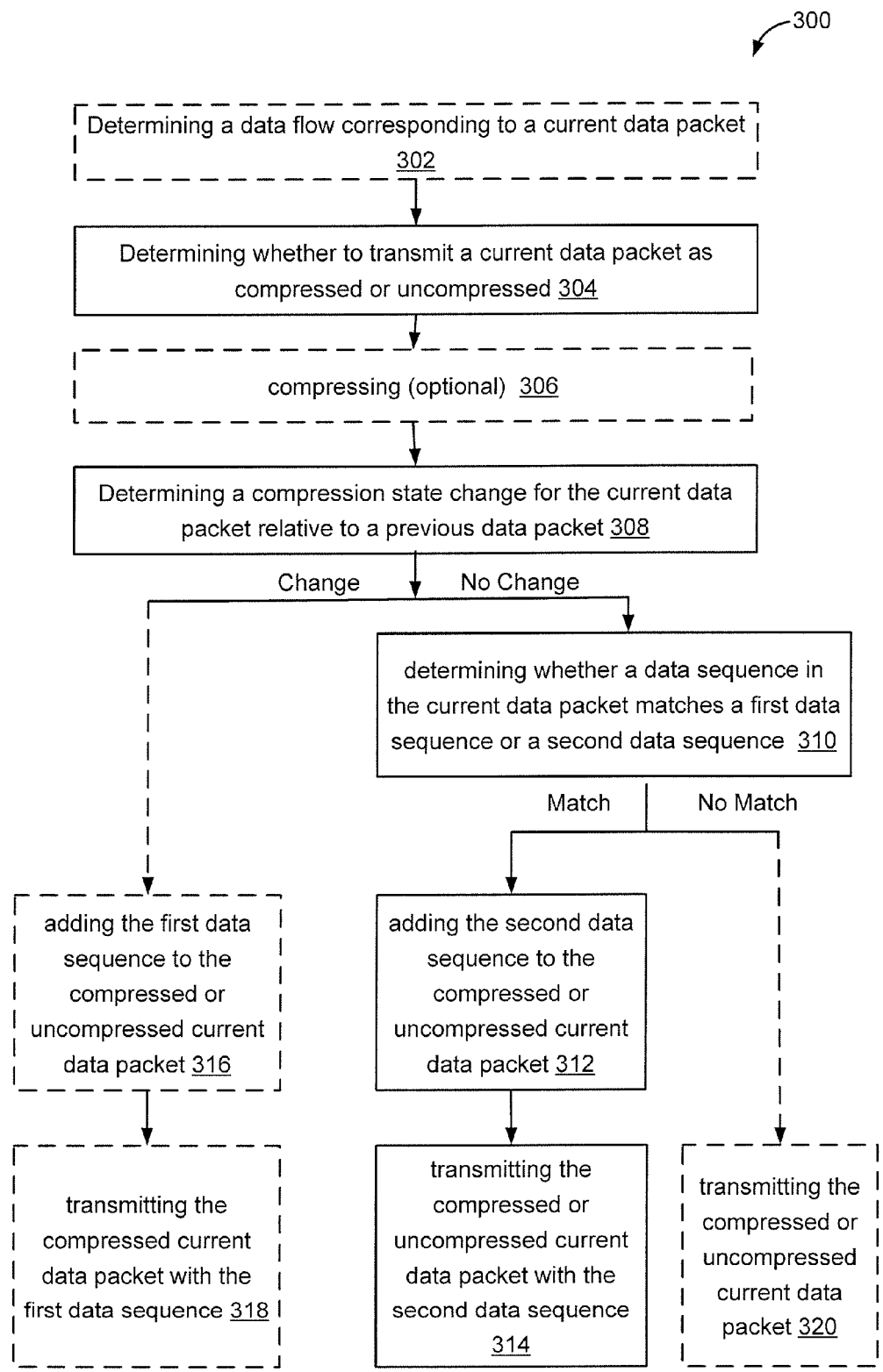

Referring to FIGS. 3 and 5, in another aspect, a method 300 of signaling the compression state of a data packet may be similar to method 200 of FIG. 2, but where the signaling in this aspect specifically identifies a change in compression state relative to a prior data packet. Further, method 300 may be an alternative or an addition to method 200, as method 300 includes operations that may be integrated into the operations of method 200.

At Block 302, an optional aspect of method 300 includes determining a data flow corresponding to the current data packet. This action and the components for performing this action may be the same as described above with respect to Block 202 of FIG. 2.

At Block 304, an aspect of method 300 may further include determining whether to transmit a current data packet as a compressed current data packet or an uncompressed current data packet. This action and the components for performing this action may be the same as described above with respect to Block 204 of FIG. 2.

At Block 306, an optional aspect of method 300 may include compressing the current data packet when determining to transmit the compressed current data packet. For example, in an aspect, compressor component 102 may include compressor 146 that is configured to compress a data packet, as described above with respect to Block 212.

At Block 308, an aspect of method 300 may further include determining a compression state change for the current data packet based on whether a previous data packet was transmitted as a compressed previous data packet or an uncompressed previous data packet. For example, in an aspect, compressor component 102 may be configured to utilize signaling 116 to indicate a change in compression state in a given data packet relative to a prior data packet. As such, in this case, compressor component 102 may include a compression state determiner component 148 configured to execute an algorithm, which may be part of compressor algorithm 106, to identify a current compression determination 150 made by compression determining component 138 and compare it to a stored prior compression state 152, e.g., compressed or uncompressed, of a prior data packet (e.g., optionally, in the same data flow) and to thereby identify a current compression state 154 having a compression state value that indicates whether or not there is a change in compression state. In other words, in one example that should not be construed as limiting, compression state determiner component 148 may set current compression state 154 with a first value to indicate a change in compression states, e.g., the current data packet is compressed while the prior data packet was uncompressed, or vice versa. Similarly, for example, compression state determiner component 148 may set current compression state 154 with a second value to indicate no change in compression states, e.g., the current data packet is compressed (or uncompressed) while the prior data packet was likewise compressed (or uncompressed). As such, compressor state determining component 148 is configured to determine a compression state change for the current data packet relative to a previous data packet, which may then be utilized to determine what signaling 116 to apply to a transmitted data packet.

At Block 310, an aspect of method 300 may further include determining whether a data sequence in the current data packet matches a first data sequence or a second data sequence when determining to transmit the uncompressed current data packet. This action and the components for performing this action may be the same as described above with respect to Block 202 of FIG. 2, except that the determination at Block 310 is triggered when compressor state determining component 148 determines no change in current compression state 154 relative to prior compression state 152, as described above. As such, in this case, compressor component 102 is configured to operate data sequence analyzer component 140 to evaluate uncompressed data packet 114 as well as compressed data packet 108.

At Block 312, an aspect of method 300 may further include adding the second data sequence to the uncompressed current data packet for transmission when the data sequence in the current data packet matches the first data sequence or the second data sequence, and further based on the compression state change. This action and the components for performing this action may be the same as described above with respect to Block 208 of FIG. 2, except that the adding at Block 312 may occur when compressor state determining component 148 determines no change in current compression state 154 relative to prior compression state 152, as described above. Further, in this case, compressor component 102 is configured to operate data sequence adding component 140 to add second data sequence 120 to both uncompressed data packet 114 as well as compressed data packet 108 when current compression state 154 indicates that there is no change in compression state associated with current data packet 104.

At Block 314, an aspect of method 300 may further include transmitting the compressed or uncompressed current data packet with the second data sequence. For example, in an aspect, compressor component 102 may operate outputting component 144, as described above, to send compressed current data packet 108 with second data sequence 120 or uncompressed data packet 114, e.g., the original current data packet 104, with second data sequence 120 out of compressor component 102, e.g., destined for de-compressor component 110.

At Block 316, an optional aspect of method 300 may further include adding the first data sequence to the compressed or uncompressed current data packet. This action and the components for performing this action may be the same as described above with respect to Block 214 of FIG. 2, except that the adding at Block 316 may occur when compressor state determining component 148 determines that there is a change in current compression state 154 relative to prior compression state 152, as described above. Further, in this case, compressor component 102 is configured to operate data sequence adding component 140 to add first data sequence 118 to both uncompressed data packet 114 as well as compressed data packet 108 when current compression state 154 indicates that there is a change in compression state associated with current data packet 104.

At Block 318, an aspect of method 300 may further include transmitting the compressed current data packet with the first data sequence. For example, in an aspect, compressor component 102 may operate outputting component 144, as described above, to send compressed current data packet 108 with first data sequence 118 out of compressor component 102, e.g., destined for de-compressor component 110.

At Block 320, an aspect of method 300 may further include transmitting the compressed current data packet or the uncompressed current data packet. For example, in an aspect, compressor component 102 For example, in an aspect where no change in compression state is determined at Block 308 and no match is determined at Block 310, compressor component 102 may operate outputting component 144, as described above, to send compressed current data packet 108 without first data sequence 118 or second data sequence 102, or to send uncompressed data packet 114 without first data sequence 118 or second data sequence 102, e.g., "as is" or just the original current data packet 104, out of compressor component 102, e.g., destined for de-compressor component 110.

Figure 4:
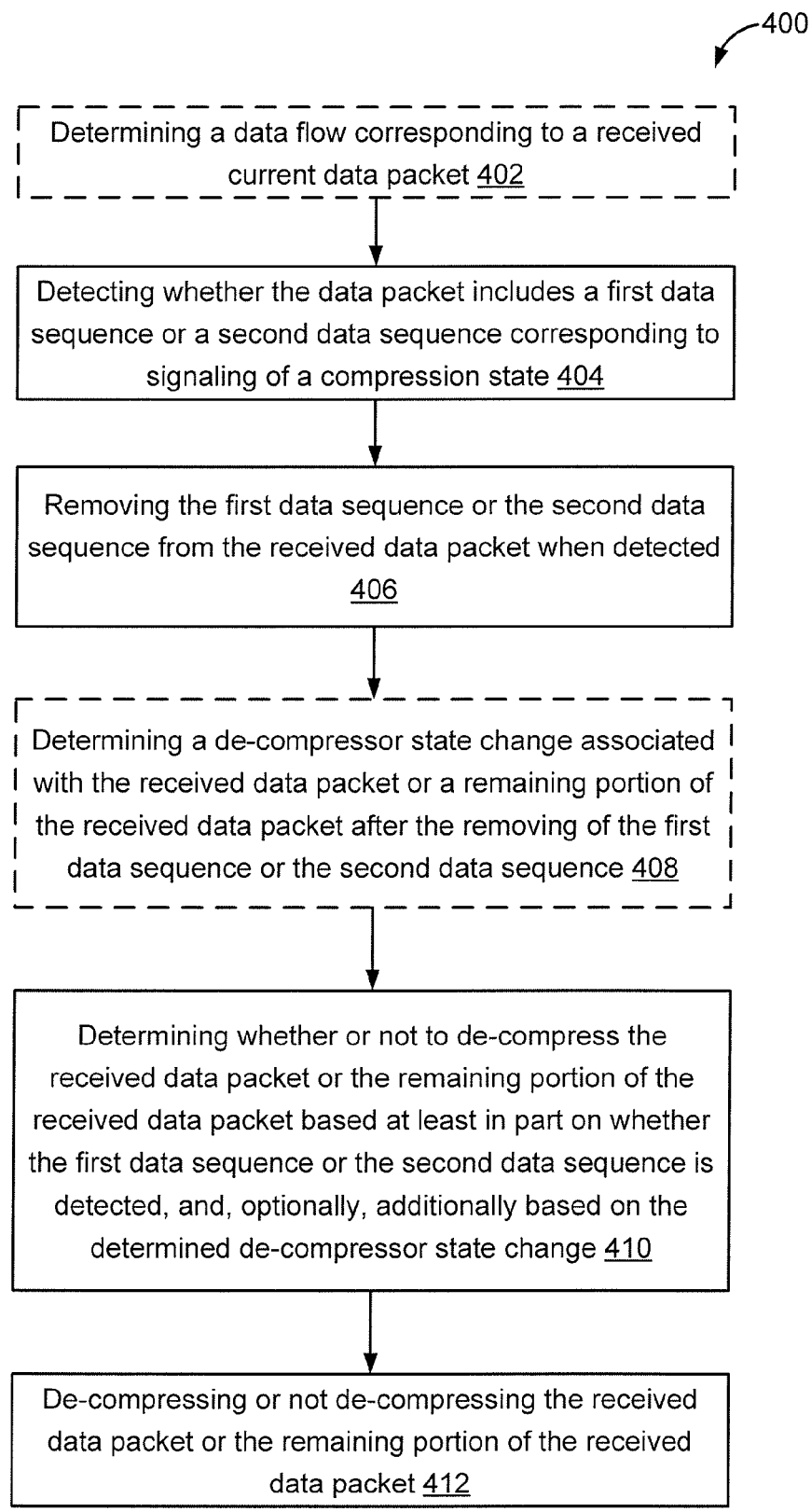
FIG. 4 is a flowchart of an aspect of a method of performing data packet de-compression.

Referring to FIGS. 4 and 5, in an aspect, a method 400 of de-compression and receiving signaling of a compression state may be executed by de-compressor component 110 of FIG. 1.

At Block 402, an optional aspect of method 400 includes determining a data flow corresponding to a received current data packet. In an aspect, for instance, de-compressor component 110 may include a flow determiner component 160, the same as or similar to flow determiner component 136, but with an interface to receive current data packet 158 (FIG. 1) from another network entity, such as wireless serving node 128 or UE 124, or from a lower protocol layer entity on a device in which de-compressor component 110 is operating. Moreover, flow determiner component 160 may execute an algorithm, which may be part of de-compressor algorithm 112, to perform the operations described to identify a data flow associated with received current data packet 158. Otherwise, this action and the components for performing this action may be the same as described above with respect to Block 202 of FIG. 2. As such, in this aspect, the de-compression described in this document may be performed on a packet-by-packet basis depending on whether or not a given data packet corresponds to a given data flow that is subject to the compression or de-compression operations of the present apparatus and methods.

At Block 404, an aspect of method 400 may further include detecting whether the data packet includes a first data sequence or a second data sequence corresponding to signaling of a compression state. For example, in an aspect, de-compressor component 110 may include a data sequence analyzer component 162, which may be the same or similar to data sequence analyzer component 140 described above. Moreover, data sequence analyzer component 162 may execute an algorithm, which may be part of de-compressor algorithm 112, to perform the operations described to identify first data sequence 118 or second data sequence 120 associated with received current data packet 158.

At Block 406, an aspect of method 400 may further include removing the first data sequence or the second data sequence from the received data packet when detected. For example, in an aspect, de-compressor component 110 may include a data sequence removal component 164 configured to execute an algorithm, which may be a part of de-compressor algorithm 112, to remove either first data sequence 118 or second data sequence 120 in response to identification of such sequences in received current data packet 158, thereby producing a remaining portion of the received data current data packet. As a result, this remaining portion, depending on the aspect, may either be compressed current data packet 108 or uncompressed current data packet 114.

At Block 408, an optional aspect of method 400 may further include determining a de-compressor state change associated with the received data packet or a remaining portion of the received data packet after the removing of the first data sequence or the second data sequence. For example, in an aspect, de-compressor component 110 may include a de-compressor state determining component 166 configured to execute an algorithm, which may be a part of de-compressor algorithm 112, to identify a current de-compressor state 168 relative to a prior de-compression state 170 based on, at least, identification of either first data sequence 118 or second data sequence 120, or an absence of such sequences, in received current data packet 158. For example, current de-compressor state 168 may have a first value indicating a change in de-compressor state, e.g., when received current data packet 158 is determined to have a different de-compression state (compressed or uncompressed) as a prior received data packet. Further, for example, current de-compressor state 168 may have a second value indicating no change in de-compressor state, e.g., when received current data packet 158 is determined to have a same de-compression state (compressed or uncompressed) as a prior received data packet.

At Block 410, an aspect of method 400 may further include determining whether or not to de-compress the received data packet or the remaining portion of the received data packet based at least in part on whether the first data sequence or the second data sequence is detected, and, optionally, additionally based on the determined de-compressor state change. For example, de-compressor component 110 may include a de-compressor determiner component 172 configured to execute one or more de-compressor algorithms, which may be part of de-compressor algorithm 112, to identify whether or not to de-compress the received current data packet 158 or the remaining portion of the received data packet. For example, in one aspect, de-compressor determiner component 172 makes a de-compression determination based on detection of first data sequence 118 or second data sequence 120 by data sequence analyzer component 162 when these data sequences respectively indicate that a data packet is compressed or uncompressed. In another aspect, for example, de-compressor determiner component 172 makes a de-compression determination based on detection of first data sequence 118 or second data sequence 120, and further based on prior de-compression state 170, when these data sequences respectively indicate a change or no change in de-compression relative to a prior data packet.

At Block 412, an aspect of method 400 may further includes de-compressing or not de-compressing the received data packet or the remaining portion of the received data packet. For example, de-compressor component 110 may include a de-compressor 172 configured to execute one or more de-compressor algorithms, which may be part of de-compressor algorithm 112, to replace compressed data associated with the remaining portion of received data packet 158 in order to re-generate current data packet 104 transmitted by compressor component 102. De-compressor 172 may be triggered to operate on the remaining portion of received data packet 158 by de-compressor state determiner component 166 upon determining a change in de-compression, based current de-compression state 168, e.g., when a prior received data packet was uncompressed.

Thus, according to the present aspects, compressor component 102 and de-compressor component 110 may respectively communicate and understand whether or not compression is applied to a give data packet.

In one example use case, which not be construed as limiting, if compressor component 102 and/or compression algorithm 106 decides to send compressed data, then compressor component 102 prefixes the compressed data with first data sequence 118 prior to transmission. If compressor component 102 and/or compression algorithm 106 decides to send the original data, and if the original data begins with first data sequence 118 or second data sequence 120, then compressor component 102 and/or compression algorithm 106 prefixes it with second data sequence 120. Further, if compressor component 102 and/or compression algorithm 106 decides to send the original data, and if the original data does not begin with first data sequence 118 or second data sequence 120, then compressor component 102 and/or compression algorithm 106 sends the data as is.

Further, at de-compressor component 110 in this example, if the received data starts with first data sequence 118, then de-compressor component 110 and/or de-compressor algorithm 112 removes this sequence. In this case, it is understood that the rest of the received data has been compressed. If the received data starts with second data sequence 120, then de-compressor component 110 and/or de-compressor algorithm 112 removes this sequence. In this case, it is understood that the rest of the received data has not been compressed. If the received data does not start with first data sequence 118 or second data sequence 120, then de-compressor component 110 and/or de-compressor algorithm 112 understands that the received data has not been compressed.

In another example use case, if current data is to be sent compressed, while the data of the previous packet from the same flow was sent uncompressed, then compressor component 102 and/or compressor algorithm 106 sets current compressor state 154 equal to a first value, e.g., a value of "1." If current data is to be sent uncompressed, while the data of the previous packet from the same flow was sent compressed, then compressor component 102 and/or compressor algorithm 106 sets current compressor state 154 equal to the first value, e.g., a value of "1." If current data is to be sent compressed, and the data of the previous packet from the same flow was also sent compressed, then compressor component 102 and/or compressor algorithm 106 sets current compressor state 154 equal to a second value, e.g., a value of "0." If current data is to be sent uncompressed, and the data of the previous packet from the same flow was also sent uncompressed, then compressor component 102 and/or compressor algorithm 106 sets current compressor state 154 equal to the second value, e.g., a value of "0."

Further, in this example, if current compressor state 154 equals first value, e.g., a value of "1," then compressor component 102 and/or compressor algorithm 106 prefixes the data to be sent with first data sequence 118 prior to transmission. If current compressor state 154 equals second value, e.g., a value of "0," and if the data to be sent begins with first data sequence 118 or second data sequence 120, then compressor component 102 and/or compressor algorithm 106 prefixes it with second data sequence 120. If current compressor state 154 equals second value, e.g., a value of "0," and if the data to be sent does not begin with first data sequence 118 or second data sequence 120, then compressor component 102 and/or compressor algorithm 106 sends the data as is.

At de-compressor component 110 in this example, if the received data starts with first data sequence 118, then de-compressor component 110 and/or de-compressor algorithm 112 removes this sequence. In this case, de-compressor component 110 and/or de-compressor algorithm 112 understands that the remaining data is considered to be the current data packet (which may be compressed or uncompressed). Further, in this case, de-compressor component 110 and/or de-compressor algorithm 112 sets current de-compressor state 168 to a first value, e.g., a value of "1," based on detecting first data sequence 118. If the received data starts with second data sequence 120, de-compressor component 110 and/or de-compressor algorithm 112 remove this sequence. In this case, de-compressor component 110 and/or de-compressor algorithm 112 understand that the remaining data is considered to be the current data packet (which may be compressed or uncompressed). Further, in this case, de-compressor component 110 and/or de-compressor algorithm 112 sets current de-compressor state 168 to a second value, e.g., a value of "0," based on detecting second data sequence 118. If the received data does not start with first data sequence 118 or second data sequence 120, then de-compressor component 110 and/or de-compressor algorithm 112 also set current de-compressor state 168 to a second value, e.g., a value of "0."

Further, at de-compressor component 110 in this example, if current de-compressor state 168 is the first value, e.g., "1," and if the data of the previously received packet from the same flow was compressed, then de-compressor component 110 and/or de-compressor algorithm 112 understand that the current packet's data is uncompressed. If current de-compressor state 168 is the first value, e.g., "1," and if the data of the previously received packet from the same flow was uncompressed, then de-compressor component 110 and/or de-compressor algorithm 112 understand that the current packet's data is compressed. If current de-compressor state 168 is the second value, e.g., "0," and if the data of the previously received packet from the same flow was compressed, then de-compressor component 110 and/or de-compressor algorithm 112 understand that the current packet's data is compressed. If current de-compressor state 168 is the second value, e.g., "0," and if the data of the previously received packet from the same flow was uncompressed, then de-compressor component 110 and/or de-compressor algorithm 112 understand that the current packet's data is uncompressed.

Further, it should be noted that first data sequence 118 and second data sequence 120 may be signaled by the radio network or core network, e.g., through radio resource control (RRC) signaling or other mechanisms. In another option, first data sequence 118 and second data sequence 120 may be static sequences defined in specifications.

Figure 6:
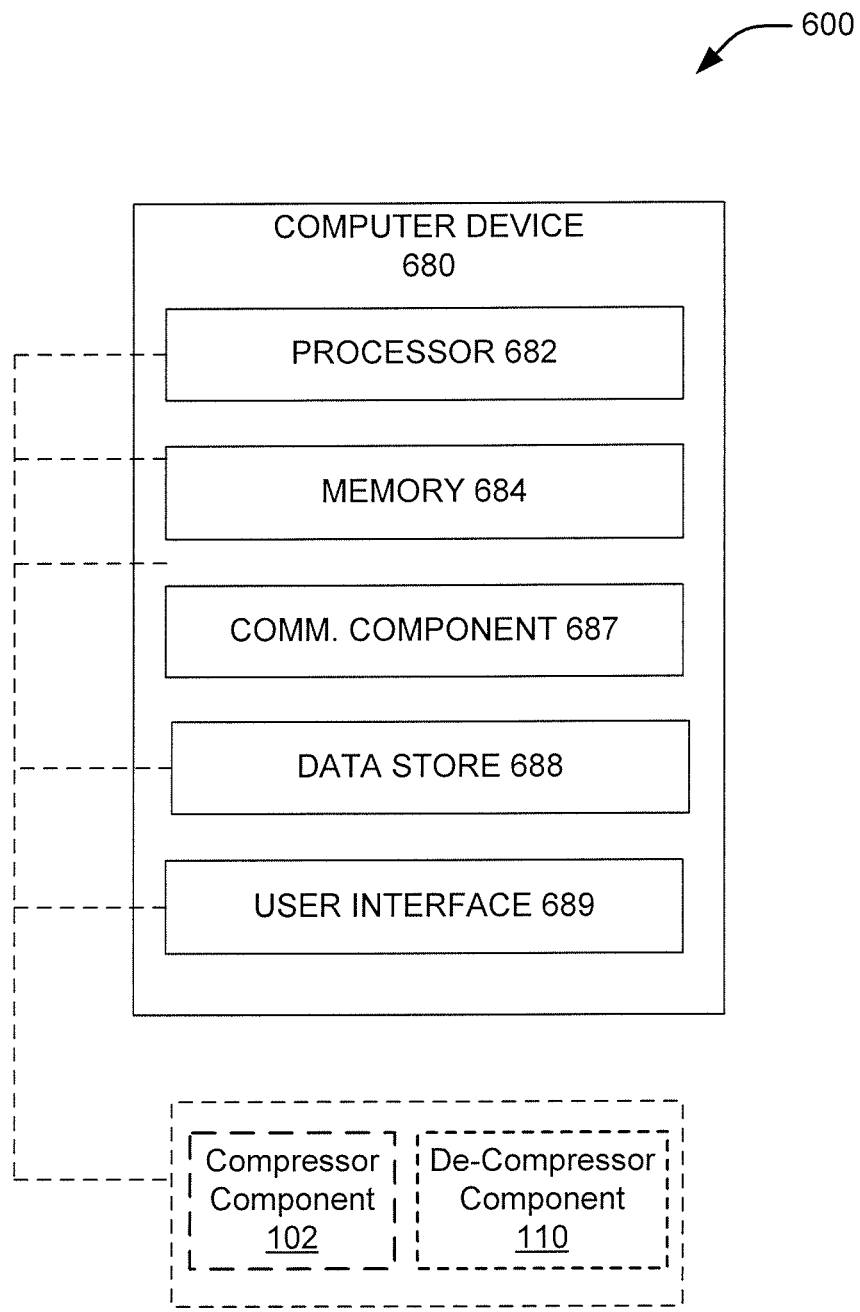
FIG. 6 is a block diagram of a specially-configured device including the compressor and/or de-compressor of FIG. 1.

Referring to the computer system 600 of FIG. 6, in one aspect, UE 124 and/or wireless serving node 128 of FIGS. 1 and 2 may be represented by a specially programmed or configured computer device 680, wherein the special programming or configuration includes compressor component 102 and/or de-compressor component 110, as described herein. For example, for implementation as UE 124 (FIGS. 1 and 5), computer device 680 may include one or more components for computing and transmitting a data from a UE 124 to network 126 via wireless serving node 128, such as in specially programmed computer readable instructions or code, firmware, hardware, or some combination thereof. Computer device 680 includes a processor 682 for carrying out processing functions associated with one or more of components and functions described herein. Processor 682 can include a single or multiple set of processors or multi-core processors. Moreover, processor 682 can be implemented as an integrated processing system and/or a distributed processing system.

Computer device 680 further includes a memory 684, such as for storing data used herein and/or local versions of applications being executed by processor 682. Memory 684 can include any type of memory usable by a computer, such as random access memory (RAM), read only memory (ROM), tapes, magnetic discs, optical discs, volatile memory, non-volatile memory, and any combination thereof.

Further, computer device 680 includes a communications component 686 that provides for establishing and maintaining communications with one or more parties utilizing hardware, software, and services as described herein. Communications component 686 may carry communications between components on computer device 680, as well as between computer device 680 and external devices, such as devices located across a communications network and/or devices serially or locally connected to computer device 680. For example, communications component 686 may include one or more buses, and may further include transmit chain components and receive chain components associated with a transmitter and receiver, respectively, or a transceiver, operable for interfacing with external devices. For example, in an aspect, a receiver of communications component 686 operates to receive one or more data via a wireless serving node 66, which may be a part of memory 684.

Additionally, computer device 680 may further include a data store 688, which can be any suitable combination of hardware and/or software, that provides for mass storage of information, databases, and programs employed in connection with aspects described herein. For example, data store 688 may be a data repository for applications not currently being executed by processor 682.

Computer device 680 may additionally include a user interface component 689 operable to receive inputs from a user of computer device 680, and further operable to generate outputs for presentation to the user. User interface component 689 may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, user interface component 689 may include one or more output devices, including but not limited to a display, a speaker, a haptic feedback mechanism, a printer, any other mechanism capable of presenting an output to a user, or any combination thereof.

Furthermore, computer device 680 may include, or may be in communication with, compressor component 102 and/or de-compressor component 110 (FIGS. 1 and 5), which may be configured to perform the functions described herein.

Figure 7:
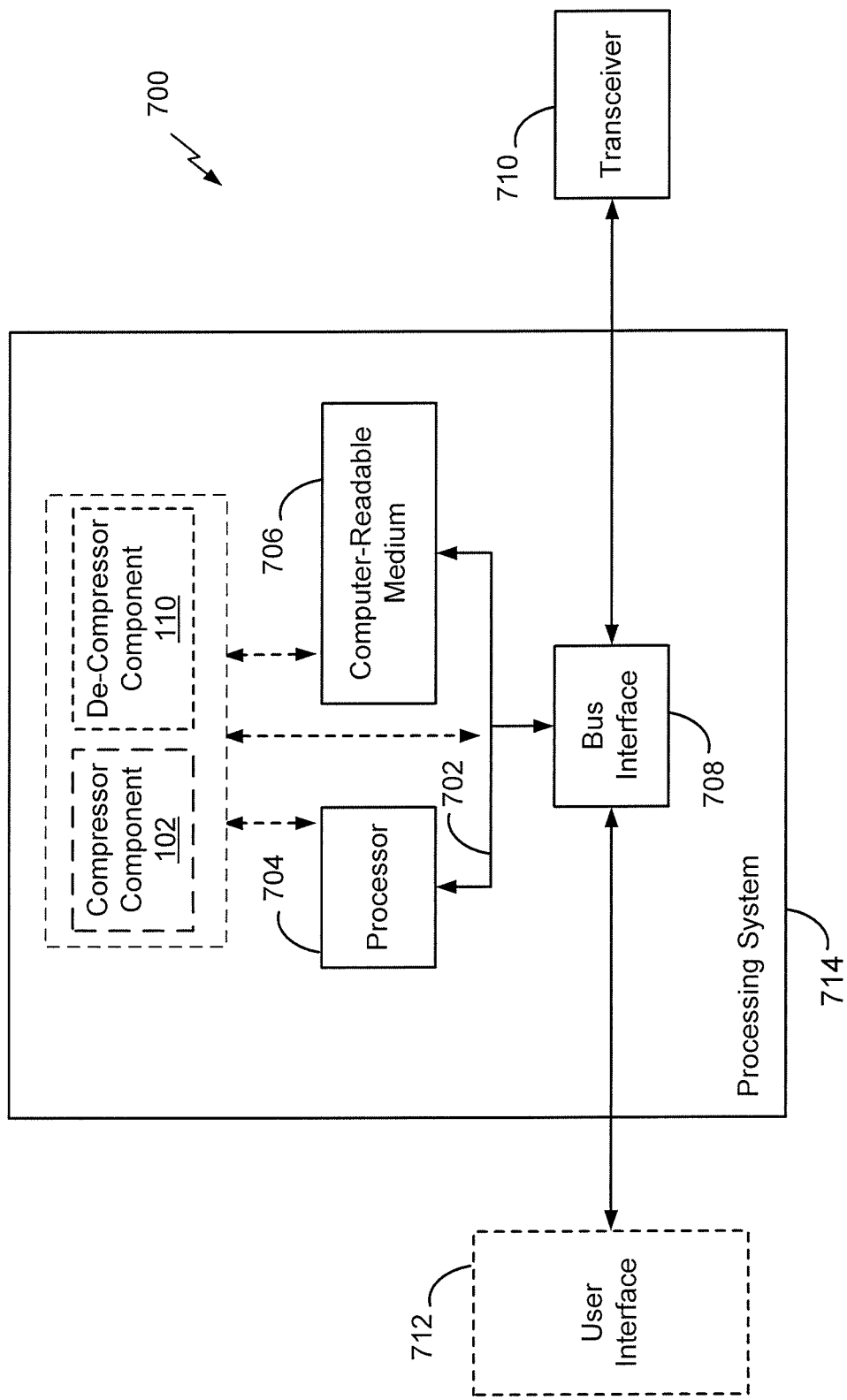
FIG. 7 is a block diagram illustrating an example of a hardware implementation for an apparatus employing a processing system to perform the functions described herein with respect to the compressor and/or de-compressor of FIG. 1.

FIG. 7 is a block diagram illustrating an example of a hardware implementation for an apparatus 700 employing a processing system 714 configured to execute compressor component 102 and/or de-compressor component 110 (FIGS. 1 and 5) as described herein. In this example, the processing system 714 may be implemented with a bus architecture, represented generally by the bus 702. The bus 702 may include any number of interconnecting buses and bridges depending on the specific application of the processing system 714 and the overall design constraints. The bus 702 links together various circuits including one or more processors, represented generally by the processor 704, and computer-readable media, represented generally by the computer-readable medium 706. The bus 702 may also link various other circuits such as timing sources, peripherals, voltage regulators, and power management circuits, which are well known in the art, and therefore, will not be described any further. A bus interface 708 provides an interface between the bus 702 and a transceiver 710. The transceiver 710 provides a means for communicating with various other apparatus over a transmission medium. Depending upon the nature of the apparatus, a user interface 710 (e.g., keypad, display, speaker, microphone, joystick) may also be provided.

The processor 704 is responsible for managing the bus 702 and general processing, including the execution of software stored on the computer-readable medium 706. The software, when executed by the processor 704, causes the processing system 714 to perform the various functions described infra for any particular apparatus. The computer-readable medium 706 may also be used for storing data that is manipulated by the processor 704 when executing software.

In an aspect, processor 704, computer-readable medium 706, or a combination of both may be configured or otherwise specially programmed to perform the functionality of the configured to execute compressor component 102 and/or de-compressor component 110 (FIGS. 1 and 5) as described herein.

The various concepts presented throughout this disclosure may be implemented across a broad variety of telecommunication systems, network architectures, and communication standards.

Figure 8:
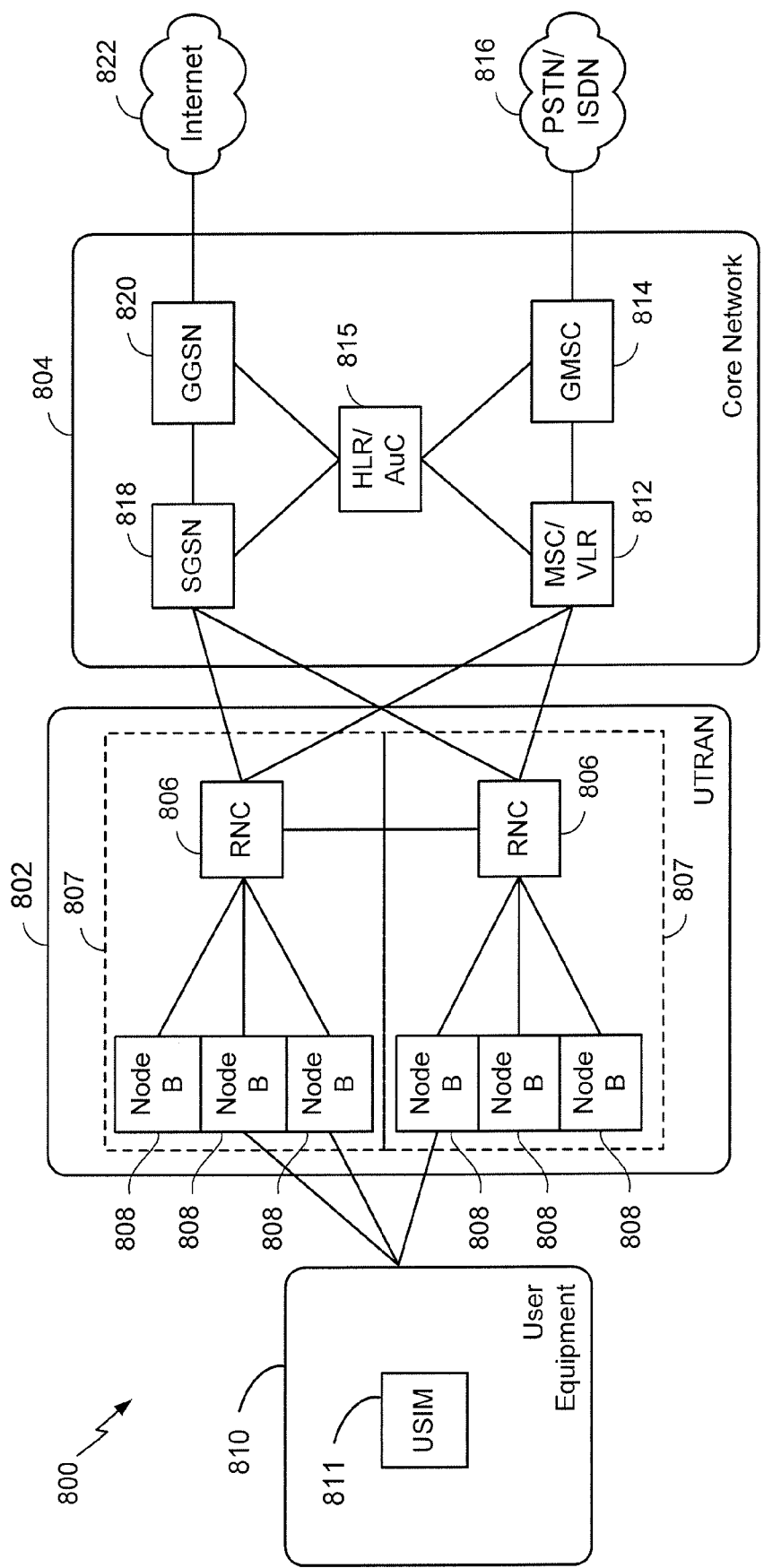
FIG. 8 is a block diagram conceptually illustrating an example of a telecommunications system including Node B and a user equipment (UE) configured to perform the functions described herein.

Referring to FIG. 8, by way of example and without limitation, the aspects of the present disclosure are presented with reference to a UMTS system 800 employing a W-CDMA air interface. A UMTS network includes three interacting domains: a Core Network (CN) 804, a UMTS Terrestrial Radio Access Network (UTRAN) 802, and User Equipment (UE) 810. Node B 808 and/or UE 810 may be equivalent to wireless serving node 128 and UE 124, respectively, and may be configured to include, for example, compressor component 102 and/or de-compressor component 110 (FIGS. 1 and 5) as described herein. In this example, the UTRAN 802 provides various wireless services including telephony, video, data, messaging, broadcasts, and/or other services. The UTRAN 802 may include a plurality of Radio Network Subsystems (RNSs) such as an RNS 807, each controlled by a respective Radio Network Controller (RNC) such as an RNC 806. Here, the UTRAN 802 may include any number of RNCs 806 and RNSs 807 in addition to the RNCs 806 and RNSs 807 illustrated herein. The RNC 806 is an apparatus responsible for, among other things, assigning, reconfiguring and releasing radio resources within the RNS 807. The RNC 806 may be interconnected to other RNCs (not shown) in the UTRAN 802 through various types of interfaces such as a direct physical connection, a virtual network, or the like, using any suitable transport network.

Communication between a UE 810 and a Node B 808 may be considered as including a physical (PHY) layer and a medium access control (MAC) layer. Further, communication between a UE 810 and an RNC 806 by way of a respective Node B 808 may be considered as including a radio resource control (RRC) layer. In the instant specification, the PHY layer may be considered layer 1; the MAC layer may be considered layer 2; and the RRC layer may be considered layer 3. Information hereinbelow utilizes terminology introduced in the RRC Protocol Specification, 3GPP TS 25.331, incorporated herein by reference.

The geographic region covered by the RNS 807 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 808 are shown in each RNS 807; however, the RNSs 807 may include any number of wireless Node Bs. The Node Bs 808 provide wireless access points to a CN 804 for any number of mobile apparatuses. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, or any other similar functioning device. The UE 810 is commonly referred to as a UE in UMTS applications, but may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. In a UMTS system, the UE 810 may further include a universal subscriber identity module (USIM) 811, which contains a user's subscription information to a network. For illustrative purposes, one UE 810 is shown in communication with a number of the Node Bs 808. The DL, also called the forward link, refers to the communication link from a Node B 808 to a UE 810, and the UL, also called the reverse link, refers to the communication link from a UE 810 to a Node B 808.

The CN 804 interfaces with one or more access networks, such as the UTRAN 802. As shown, the CN 804 is a GSM core network. However, as those skilled in the art will recognize, the various concepts presented throughout this disclosure may be implemented in a RAN, or other suitable access network, to provide UEs with access to types of CNs other than GSM networks.

The CN 804 includes a circuit-switched (CS) domain and a packet-switched (PS) domain. Some of the circuit-switched elements are a Mobile services Switching Centre (MSC), a Visitor location register (VLR) and a Gateway MSC. Packet-switched elements include a Serving GPRS Support Node (SGSN) and a Gateway GPRS Support Node (GGSN). Some network elements, like EIR, HLR, VLR and AuC may be shared by both of the circuit-switched and packet-switched domains. In the illustrated example, the CN 804 supports circuit-switched services with a MSC 812 and a GMSC 814. In some applications, the GMSC 814 may be referred to as a media gateway (MGW). One or more RNCs, such as the RNC 806, may be connected to the MSC 812. The MSC 812 is an apparatus that controls call setup, call routing, and UE mobility functions. The MSC 812 also includes a VLR that contains subscriber-related information for the duration that a UE is in the coverage area of the MSC 812. The GMSC 814 provides a gateway through the MSC 812 for the UE to access a circuit-switched network 816. The GMSC 814 includes a home location register (HLR) 815 containing subscriber data, such as the data reflecting the details of the services to which a particular user has subscribed. The HLR is also associated with an authentication center (AuC) that contains subscriber-specific authentication data. When a call is received for a particular UE, the GMSC 814 queries the HLR 815 to determine the UE's location and forwards the call to the particular MSC serving that location.

The CN 804 also supports packet-data services with a serving GPRS support node (SGSN) 818 and a gateway GPRS support node (GGSN) 820. GPRS, which stands for General Packet Radio Service, is designed to provide packet-data services at speeds higher than those available with standard circuit-switched data services. The GGSN 820 provides a connection for the UTRAN 802 to a packet-based network 1262. The packet-based network 1262 may be the Internet, a private data network, or some other suitable packet-based network. The primary function of the GGSN 820 is to provide the UEs 810 with packet-based network connectivity. Data packets may be transferred between the GGSN 820 and the UEs 810 through the SGSN 818, which performs primarily the same functions in the packet-based domain as the MSC 812 performs in the circuit-switched domain.

An air interface for UMTS may utilize a spread spectrum Direct-Sequence Code Division Multiple Access (DS-CDMA) system. The spread spectrum DS-CDMA spreads user data through multiplication by a sequence of pseudorandom bits called chips. The "wideband" W-CDMA air interface for UMTS is based on such direct sequence spread spectrum technology and additionally calls for a frequency division duplexing (FDD). FDD uses a different carrier frequency for the UL and DL between a Node B 808 and a UE 810. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles may be equally applicable to a TD-SCDMA air interface.

An HSPA air interface includes a series of enhancements to the 3G/W-CDMA air interface, facilitating greater throughput and reduced latency. Among other modifications over prior releases, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink, or EUL).

HSDPA utilizes as its transport channel the high-speed downlink shared channel (HS-DSCH). The HS-DSCH is implemented by three physical channels: the high-speed physical downlink shared channel (HS-PDSCH), the high-speed shared control channel (HS-SCCH), and the high-speed dedicated physical control channel (HS-DPCCH).

Among these physical channels, the HS-DPCCH carries the HARQ ACK/NACK signaling on the uplink to indicate whether a corresponding packet transmission was decoded successfully. That is, with respect to the downlink, the UE 810 provides feedback to the node B 808 over the HS-DPCCH to indicate whether it correctly decoded a packet on the downlink.

HS-DPCCH further includes feedback signaling from the UE 810 to assist the node B 808 in taking the right decision in terms of modulation and coding scheme and precoding weight selection, this feedback signaling including the CQI and PCI.

"HSPA Evolved" or HSPA+ is an evolution of the HSPA standard that includes MIMO and 64-QAM, enabling increased throughput and higher performance That is, in an aspect of the disclosure, the node B 808 and/or the UE 810 may have multiple antennas supporting MIMO technology. The use of MIMO technology enables the node B 808 to exploit the spatial domain to support spatial multiplexing, beamforming, and transmit diversity.

Multiple Input Multiple Output (MIMO) is a term generally used to refer to multi-antenna technology, that is, multiple transmit antennas (multiple inputs to the channel) and multiple receive antennas (multiple outputs from the channel). MIMO systems generally enhance data transmission performance, enabling diversity gains to reduce multipath fading and increase transmission quality, and spatial multiplexing gains to increase data throughput.

Spatial multiplexing may be used to transmit different streams of data simultaneously on the same frequency. The data steams may be transmitted to a single UE 810 to increase the data rate, or to multiple UEs 810 to increase the overall system capacity. This is achieved by spatially precoding each data stream and then transmitting each spatially precoded stream through a different transmit antenna on the downlink. The spatially precoded data streams arrive at the UE(s) 810 with different spatial signatures, which enables each of the UE(s) 810 to recover the one or more the data streams destined for that UE 810. On the uplink, each UE 810 may transmit one or more spatially precoded data streams, which enables the node B 808 to identify the source of each spatially precoded data stream.

Spatial multiplexing may be used when channel conditions are good. When channel conditions are less favorable, beamforming may be used to focus the transmission energy in one or more directions, or to improve transmission based on characteristics of the channel. This may be achieved by spatially precoding a data stream for transmission through multiple antennas. To achieve good coverage at the edges of the cell, a single stream beamforming transmission may be used in combination with transmit diversity.

Generally, for MIMO systems utilizing n transmit antennas, n transport blocks may be transmitted simultaneously over the same carrier utilizing the same channelization code. Note that the different transport blocks sent over the n transmit antennas may have the same or different modulation and coding schemes from one another.

On the other hand, Single Input Multiple Output (SIMO) generally refers to a system utilizing a single transmit antenna (a single input to the channel) and multiple receive antennas (multiple outputs from the channel). Thus, in a SIMO system, a single transport block is sent over the respective carrier.

Figure 9:
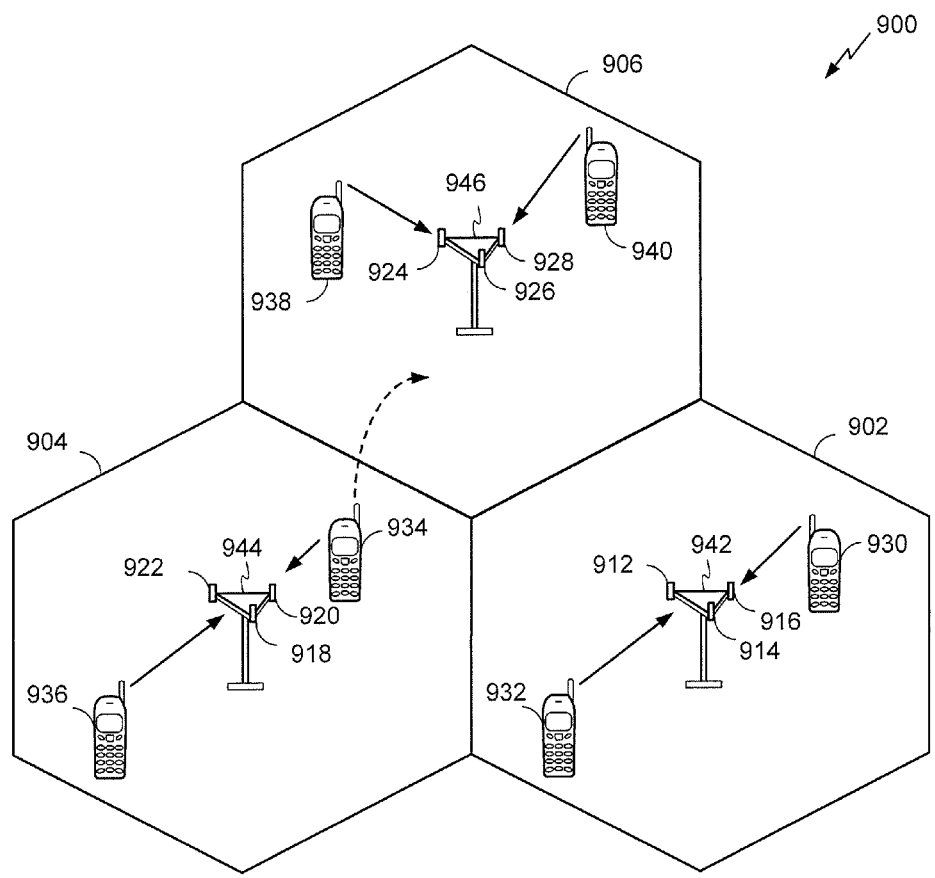
FIG. 9 is a conceptual diagram illustrating an example of an access network for use with a Node B or a UE configured to perform the functions described herein.

Referring to FIG. 9, an access network 900 in a UTRAN architecture is illustrated, where Node Bs and UEs may be equivalent to wireless serving node 128 and UE 124, and may execute compressor component 102 and/or de-compressor component 110 (FIGS. 1 and 5) as described herein. The multiple access wireless communication system includes multiple cellular regions (cells), including cells 902, 904, and 906, each of which may include one or more sectors. The multiple sectors can be formed by groups of antennas with each antenna responsible for communication with UEs in a portion of the cell. For example, in cell 902, antenna groups 912, 913, and 916 may each correspond to a different sector. In cell 904, antenna groups 918, 920, and 922 each correspond to a different sector. In cell 906, antenna groups 924, 926, and 928 each correspond to a different sector. The cells 902, 904 and 906 may include several wireless communication devices, e.g., User Equipment or UEs, which may be in communication with one or more sectors of each cell 902, 904 or 906. For example, UEs 930 and 932 may be in communication with Node B 942, UEs 934 and 936 may be in communication with Node B 944, and UEs 938 and 940 can be in communication with Node B 946. Here, each Node B 942, 944, 946 is configured to provide an access point to a CN 804 (see FIG. 8) for all the UEs 930, 932, 934, 936, 938, 940 in the respective cells 902, 904, and 906.

As the UE 934 moves from the illustrated location in cell 904 into cell 906, a serving cell change (SCC) or handover may occur in which communication with the UE 934 transitions from the cell 904, which may be referred to as the source cell, to cell 906, which may be referred to as the target cell. Management of the handover procedure may take place at the UE 934, at the Node Bs corresponding to the respective cells, at a radio network controller 806 (see FIG. 8), or at another suitable node in the wireless network. For example, during a call with the source cell 904, or at any other time, the UE 934 may monitor various parameters of the source cell 904 as well as various parameters of neighboring cells such as cells 906 and 902. Further, depending on the quality of these parameters, the UE 934 may maintain communication with one or more of the neighboring cells. During this time, the UE 934 may maintain an Active Set, that is, a list of cells that the UE 934 is simultaneously connected to (i.e., the UTRA cells that are currently assigning a downlink dedicated physical channel DPCH or fractional downlink dedicated physical channel F-DPCH to the UE 934 may constitute the Active Set).

The modulation and multiple access scheme employed by the access network 900 may vary depending on the particular telecommunications standard being deployed. By way of example, the standard may include Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. The standard may alternately be Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), and Flash-OFDM employing OFDMA. CDMA2000 and UMB are described in documents from the 3GPP2 organization. The actual wireless communication standard and the multiple access technology employed will depend on the specific application and the overall design constraints imposed on the system.

The radio protocol architecture may take on various forms depending on the particular application. An example for an HSPA system will now be presented with reference to FIG. 10.

Figure 10:
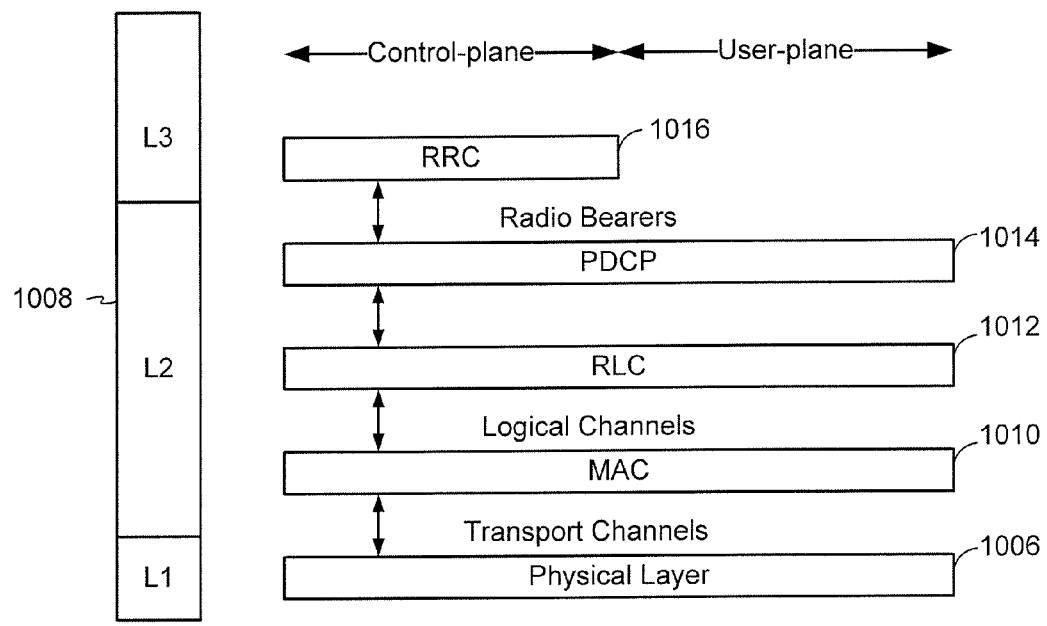
FIG. 10 is a conceptual diagram illustrating an example of a radio protocol architecture for the user and control planes for a base station and/or a UE configured to perform the functions described herein.

FIG. 10 is a conceptual diagram illustrating an example of the radio protocol architecture 1000 for the user plane 1002 and the control plane 1004, which may be utilized by wireless serving node 128 and/or UE 124 of FIG. 1. The radio protocol architecture 1000 for the UE and node B is shown with three layers: Layer 1 1006, Layer 2 1008, and Layer 3 1010. Layer 1 1006 is the lowest lower and implements various physical layer signal processing functions. As such, Layer 1 1006 includes the physical layer 1007. Layer 2 (L2 layer) 1008 is above the physical layer 1007 and is responsible for the link between the UE and node B over the physical layer 1007. Layer 3 (L3 layer) 1010 includes a radio resource control (RRC) sublayer 1014. The RRC sublayer 1014 handles the control plane signaling of Layer 3 between the UE and the UTRAN.

In the user plane, the L2 layer 1008 includes a media access control (MAC) sublayer 1009, a radio link control (RLC) sublayer 1011, and a packet data convergence protocol (PDCP) 1013 sublayer, which are terminated at the node B on the network side. Although not shown, the UE may have several upper layers above the L2 layer 1008 including a network layer (e.g., IP layer) that is terminated at a PDN gateway on the network side, and an application layer that is terminated at the other end of the connection (e.g., far end UE, server, etc.).

The PDCP sublayer 1013 provides multiplexing between different radio bearers and logical channels. The PDCP sublayer 1013 also provides header compression for upper layer data packets to reduce radio transmission overhead, security by ciphering the data packets, and handover support for UEs between node Bs. The RLC sublayer 1011 provides segmentation and reassembly of upper layer data packets, retransmission of lost data packets, and reordering of data packets to compensate for out-of-order reception due to hybrid automatic repeat request (HARQ). The MAC sublayer 1009 provides multiplexing between logical and transport channels. The MAC sublayer 1009 is also responsible for allocating the various radio resources (e.g., resource blocks) in one cell among the UEs. The MAC sublayer 1009 is also responsible for HARQ operations.

Figure 11:
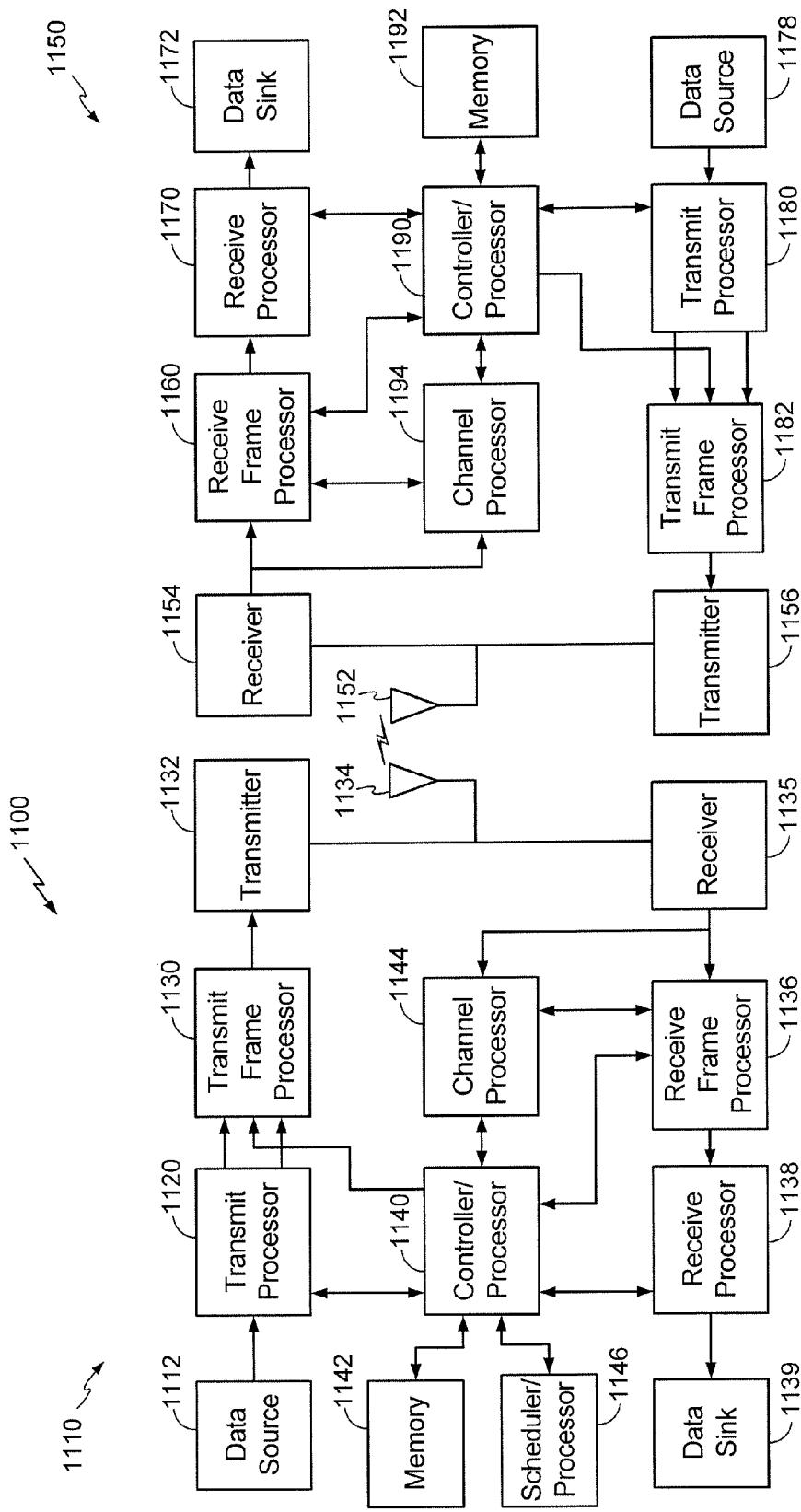
FIG. 11 is a block diagram conceptually illustrating an example of a Node B in communication with a UE in a telecommunications system configured to perform the functions described herein.

FIG. 11 is a block diagram of a communication system 1100 including a Node B 1110 in communication with a UE 1150, where Node B 1110 may be wireless serving node 128 within network 100 and the UE 1150 may be UE 124 according to the aspect described herein. In the downlink communication, a transmit processor 1120 may receive data from a data source 1115 and control signals from a controller/processor 1140. The transmit processor 1120 provides various signal processing functions for the data and control signals, as well as reference signals (e.g., pilot signals). For example, the transmit processor 1120 may provide cyclic redundancy check (CRC) codes for error detection, coding and interleaving to facilitate forward error correction (FEC), mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. Channel estimates from a channel processor 1144 may be used by a controller/processor 1140 to determine the coding, modulation, spreading, and/or scrambling schemes for the transmit processor 1120. These channel estimates may be derived from a reference signal transmitted by the UE 1150 or from feedback from the UE 1150. The symbols generated by the transmit processor 1120 are provided to a transmit frame processor 1130 to create a frame structure. The transmit frame processor 1130 creates this frame structure by multiplexing the symbols with information from the controller/processor 1140, resulting in a series of frames. The frames are then provided to a transmitter 1132, which provides various signal conditioning functions including amplifying, filtering, and modulating the frames onto a carrier for downlink transmission over the wireless medium through antenna 1134. The antenna 1134 may include one or more antennas, for example, including beam steering bidirectional adaptive antenna arrays or other similar beam technologies.

At the UE 1150, a receiver 1154 receives the downlink transmission through an antenna 1152 and processes the transmission to recover the information modulated onto the carrier. The information recovered by the receiver 1154 is provided to a receive frame processor 1160, which parses each frame, and provides information from the frames to a channel processor 1194 and the data, control, and reference signals to a receive processor 1170. The receive processor 1170 then performs the inverse of the processing performed by the transmit processor 1120 in the Node B 1110. More specifically, the receive processor 1170 descrambles and despreads the symbols, and then determines the most likely signal constellation points transmitted by the Node B 1110 based on the modulation scheme. These soft decisions may be based on channel estimates computed by the channel processor 1194. The soft decisions are then decoded and deinterleaved to recover the data, control, and reference signals. The CRC codes are then checked to determine whether the frames were successfully decoded. The data carried by the successfully decoded frames will then be provided to a data sink 1172, which represents applications running in the UE 1150 and/or various user interfaces (e.g., display). Control signals carried by successfully decoded frames will be provided to a controller/processor 1190. When frames are unsuccessfully decoded by the receiver processor 1170, the controller/processor 1190 may also use an acknowledgement (ACK) and/or negative acknowledgement (NACK) protocol to support retransmission requests for those frames.

In the uplink, data from a data source 1178 and control signals from the controller/processor 1190 are provided to a transmit processor 1180. The data source 1178 may represent applications running in the UE 1150 and various user interfaces (e.g., keyboard). Similar to the functionality described in connection with the downlink transmission by the Node B 1110, the transmit processor 1180 provides various signal processing functions including CRC codes, coding and interleaving to facilitate FEC, mapping to signal constellations, spreading with OVSFs, and scrambling to produce a series of symbols. Channel estimates, derived by the channel processor 1194 from a reference signal transmitted by the Node B 1110 or from feedback contained in the midamble transmitted by the Node B 1110, may be used to select the appropriate coding, modulation, spreading, and/or scrambling schemes. The symbols produced by the transmit processor 1180 will be provided to a transmit frame processor 1182 to create a frame structure. The transmit frame processor 1182 creates this frame structure by multiplexing the symbols with information from the controller/processor 1190, resulting in a series of frames. The frames are then provided to a transmitter 1156, which provides various signal conditioning functions including amplification, filtering, and modulating the frames onto a carrier for uplink transmission over the wireless medium through the antenna 1152.

The uplink transmission is processed at the Node B 1110 in a manner similar to that described in connection with the receiver function at the UE 1150. A receiver 1135 receives the uplink transmission through the antenna 1134 and processes the transmission to recover the information modulated onto the carrier. The information recovered by the receiver 1135 is provided to a receive frame processor 1136, which parses each frame, and provides information from the frames to the channel processor 1144 and the data, control, and reference signals to a receive processor 1138. The receive processor 1138 performs the inverse of the processing performed by the transmit processor 1180 in the UE 1150. The data and control signals carried by the successfully decoded frames may then be provided to a data sink 1139 and the controller/processor, respectively. If some of the frames were unsuccessfully decoded by the receive processor, the controller/processor 1140 may also use an acknowledgement (ACK) and/or negative acknowledgement (NACK) protocol to support retransmission requests for those frames.

The controller/processors 1140 and 1190 may be used to direct the operation at the Node B 1110 and the UE 1150, respectively. For example, the controller/processors 1140 and 1190 may provide various functions including timing, peripheral interfaces, voltage regulation, power management, and other control functions. The computer readable media of memories 1142 and 1192 may store data and software for the Node B 1110 and the UE 1150, respectively. A scheduler/processor 1146 at the Node B 1110 may be used to allocate resources to the UEs and schedule downlink and/or uplink transmissions for the UEs.

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.15 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

In accordance with various aspects of the disclosure, an element, or any portion of an element, or any combination of elements may be implemented with a "processing system" or processor (FIG. 9 or 10) that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 1206 (FIG. 10). The computer-readable medium 1206 (FIG. 10) may be a non-transitory computer-readable medium. A non-transitory computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of wireless communication, comprising:
    determining, at a compressor component, whether to transmit a current data packet as a compressed current data packet or an uncompressed current data packet;
    determining whether a data sequence in the current data packet matches a first data sequence or a second data sequence in response to determining to transmit the uncompressed current data packet, wherein the first data sequence is configured to indicate a first compression state and the second data sequence is configured to indicate a second compression state;
    determining a compression state change for the current data packet based on whether a previous data packet was transmitted as a compressed previous data packet or an uncompressed previous data packet;
    adding the second data sequence to the uncompressed current data packet for transmission in response to the data sequence in the current data packet matching the first data sequence or the second data sequence, the second data sequence being added based on the compression state change; and
    transmitting the uncompressed current data packet with the second data sequence when the data sequence in the current data packet matches the first data sequence or the second data sequence.

2. The method of claim 1, further comprising:
    wherein determining whether the data sequence in the current data packet matches the first data sequence or the second data sequence further comprises determining no match; and
    transmitting the uncompressed current data packet when the data sequence in the current data packet does not match the first data sequence or the second data sequence.

3. The method of claim 1, further comprising:
    compressing the current data packet when determining to transmit the compressed current data packet;
    adding the first data sequence to the compressed current data packet for transmission when determining to transmit the compressed current data packet, wherein the first data sequence indicates compressed data; and
    transmitting the compressed current data packet with the first data sequence.

4. The method of claim 1, wherein the first data sequence and wherein the second data sequence each further comprise a prefix.

5. The method of claim 1, wherein the first data sequence and the second data sequence differ by at least one bit when the first data sequence and the second data sequence have a same length, and wherein a selected one of the first data sequence and the second data sequence cannot be obtained from a remaining one of the first data sequence and the second data sequence by adding a suffix.

6. The method of claim 1, further comprising:
    determining a data flow corresponding to the current data packet; and
    wherein determining whether to transmit the current data packet as the compressed current data packet or the uncompressed current data packet further comprises determining relative to a previous data packet in the data flow.

7. The method of claim 6, wherein the determining of the data flow further comprises determining based on at least one of a port or an address corresponding to the current data packet.

8. The method of claim 1, wherein the second data sequence indicates uncompressed data.

9. The method of claim 1, wherein the second data sequence indicates whether or not there is a change in a compression state.

10. The method of claim 1, further comprising:
    setting a current compressor state variable to a second state value indicating no change in the compression state based on determining to transmit the uncompressed current data packet and based on determining that the previous data packet was transmitted as the uncompressed previous data packet;
    wherein adding the second data sequence is further based on the second state value; and
    wherein transmitting the uncompressed current data packet with the second data sequence indicates no change in the compression state.

11. The method of claim 1, further comprising:
    setting a current compressor state variable to a second state value indicating no change in the compression state based on determining to transmit the uncompressed current data packet and based on determining that the previous data packet was transmitted as the uncompressed previous data packet;
    determining the data sequence in the current data packet does not match the first data sequence or the second data sequence; and
    transmitting the uncompressed current data packet when there is no change in the compression state and when the data sequence in the current data packet does not match the first data sequence or the second data sequence.

12. The method of claim 1, further comprising:
    setting a current compressor state variable to a second state value indicating no change in the compression state based on determining to transmit the compressed current data packet and based on determining that the previous data packet was transmitted as the compressed previous data packet;
    wherein the determining determines that the data sequence in the current data packet matches the first data sequence or the second data sequence; and
    transmitting the compressed current data packet when there is no change in the compression state and when the data sequence in the current data packet matches the first data sequence or the second data sequence.

13. The method of claim 1, further comprising:
setting a current compressor state variable to a first state value indicating a change in the compression state based on determining to transmit the uncompressed current data packet and based on determining that the previous data packet was transmitted as the compressed previous data packet; and
transmitting either the uncompressed current data packet or the compressed current data packet with the first data sequence when the change in compression state is determined.

14. An apparatus for wireless communication, comprising:
a transceiver:
a memory storing data; and
a processor in communication with the memory and the transceiver, wherein the processor and the memory are configured with:
  means for determining whether to transmit a current data packet as a compressed current data packet or an uncompressed current data packet;
  means for determining whether a data sequence in the current data packet matches a first data sequence or a second data sequence in response to determining to transmit the uncompressed current data packet, wherein the first data sequence is configured to indicate a first compression state and the second data sequence is configured to indicate a second compression state;
  means for determining a compression state change for the current data packet based on whether a previous data packet was transmitted as a compressed previous data packet or an uncompressed previous data packet;
  means for adding add the second data sequence to the uncompressed current data packet for transmission in response to the data sequence in the current data packet matching the first data sequence or the second data sequence, the second data sequence being added based on the compression state change; and
  means for transmitting the uncompressed current data packet with the second data sequence when the data sequence in the current data packet matches the first data sequence or the second data sequence.

15. An apparatus for wireless communication, comprising:
a transceiver;
a memory storing data; and
a processor in communication with the memory and the transceiver, wherein the processor and the memory are configured to:
  determine, at a compressor component, whether to transmit a current data packet as a compressed current data packet or an uncompressed current data packet;
  determine whether a data sequence in the current data packet matches a first data sequence or a second data sequence in response to determining to transmit the uncompressed current data packet, wherein the first data sequence is configured to indicate a first compression state and the second data sequence is configured to indicate a second compression state;
  determine a compression state change for the current data packet based on whether a previous data packet was transmitted as a compressed previous data packet or an uncompressed previous data packet;
  add the second data sequence to the uncompressed current data packet for transmission in response to the data sequence in the current data packet matching the first data sequence or the second data sequence, the second data sequence being added based on the compression state change; and
  transmit, via the transceiver, the uncompressed current data packet with the second data sequence when the data sequence in the current data packet matches the first data sequence or the second data sequence.

16. The apparatus of claim 15, wherein the processor and memory are further configured to:
  compress the current data packet when determining to transmit the compressed current data packet;
  add the first data sequence to the compressed current data packet for transmission, wherein the first data sequence indicates compressed data; and
  transmit the compressed current data packet with the first data sequence.

17. The apparatus of claim 15, wherein the first data sequence and the second data sequence each further comprise a prefix.

18. The apparatus of claim 15, wherein the first data sequence and the second data sequence differ by at least one bit when the first data sequence and the second data sequence have a same length, and wherein a selected one of the first data sequence and the second data sequence cannot be obtained from a remaining one of the first data sequence and the second data sequence by adding a suffix.

19. The apparatus of claim 15, wherein the processor and memory are further configured to:
  determine a data flow corresponding to the current data packet; and
  determine whether to transmit the current data packet as the compressed current data packet or the uncompressed current data packet relative to a previous data packet in the data flow.

20. The apparatus of claim 19, wherein the processor and memory are further configured to determine the data flow based on at least one of a port or an address corresponding to the current data packet.

21. The apparatus of 15, wherein the second data sequence indicates uncompressed data.

22. The apparatus of claim 15, wherein the second data sequence indicates whether or not there is a change in a compression state.

23. The apparatus of claim 15, wherein the processor and memory are further configured to:
  set a current compressor state variable to a second state value indicating no change in the compression state based on the compression determining component determining to transmit the uncompressed current data packet and based on determining that the previous data packet was transmitted as the uncompressed previous data packet;
  add the second data sequence based on the second state value; and
  wherein the uncompressed current data packet transmitted with the second data sequence indicates no change in the compression state.

24. The apparatus of claim 15, wherein the processor and memory are further configured to:
  set a current compressor state variable to a second state value indicating no change in the compression state based on determining to transmit the uncompressed current data packet and based on determining that the previous data packet was transmitted as the uncompressed previous data packet;

determine the data sequence in the current data packet does not match the first data sequence or the second data sequence; and transmit the uncompressed current data packet when there is no change in the compression state and when the data sequence in the current data packet does not match the first data sequence or the second data sequence.

25. The apparatus of claim 15, wherein the processor and memory are further configured to:

set a current compressor state variable to a second state value indicating no change in the compression state based on determining to transmit the compressed current data packet and based on determining that the previous data packet was transmitted as the compressed previous data packet;

determine that the data sequence in the current data packet matches the first data sequence or the second data sequence; and transmit the compressed current data packet when there is no change in the compression state and when the data sequence in the current data packet matches the first data sequence or the second data sequence.

26. The apparatus of claim 15, wherein the processor and memory are further configured to:

set a current compressor state variable to a first state value indicating a change in the compression state based on determining to transmit the uncompressed current data packet and based on determining that the previous data packet was transmitted as the compressed previous data packet; and transmit either the uncompressed current data packet or the compressed current data packet with the first data sequence when the change in compression state is determined.

27. The apparatus of claim 15, wherein the processor and memory are further configured to transmit the uncompressed current data packet when the data sequence in the current data packet does not match the first data sequence or the second data sequence.

28. A method of wireless communication, comprising:

determining, at a compressor component, whether to transmit a current data packet as a compressed current data packet or an uncompressed current data packet;

determining whether a data sequence in the current data packet matches a first data sequence or a second data sequence in response to determining to transmit the compressed current data packet, wherein the first data sequence is configured to indicate a first compression state and the second data sequence is configured to indicate a second compression state;

determining a compression state change for the current data packet based on whether a previous data packet was transmitted as a compressed previous data packet or an uncompressed previous data packet;

adding the first data sequence to the compressed current data packet for transmission in response to the data sequence in the current data packet matching the first data sequence or the second data sequence, the first data sequence being added based on the compression state change; and transmitting the compressed current data packet with the first data sequence when the data sequence in the current data packet matches the first data sequence or the second data sequence.

29. The method of claim 28, wherein the first data sequence indicates compressed data.

* * * * *